United States Patent
Reiter et al.

(10) Patent No.: US 10,586,793 B2
(45) Date of Patent: Mar. 10, 2020

(54) SEMICONDUCTOR DEVICES AND METHODS FOR OPERATING SEMICONDUCTOR DEVICES

(71) Applicant: Infineon Technologies AG, Neubiberg (DE)

(72) Inventors: Tomas Manuel Reiter, Munich (DE); Frank Wolter, Munich (DE)

(73) Assignee: Infineon Technologies AG, Neubiberg (DE)

( * ) Notice: Subject to any disclaimer, the term of this patent is extended or adjusted under 35 U.S.C. 154(b) by 20 days.

(21) Appl. No.: 15/812,166

(22) Filed: Nov. 14, 2017

(65) Prior Publication Data

US 2018/0138169 A1 May 17, 2018

(30) Foreign Application Priority Data

Nov. 15, 2016 (DE) .................. 10 2016 121 912

(51) Int. Cl.
| | | |
|---|---|---|
| *H01L 27/06* | (2006.01) | |
| *H01L 29/739* | (2006.01) | |
| *H01L 21/66* | (2006.01) | |
| *H01L 21/77* | (2017.01) | |
| *H01L 29/417* | (2006.01) | |

(52) U.S. Cl.
CPC .......... *H01L 27/0664* (2013.01); *H01L 21/77* (2013.01); *H01L 22/12* (2013.01); *H01L 22/14* (2013.01); *H01L 29/41708* (2013.01); *H01L 29/7395* (2013.01)

(58) Field of Classification Search
CPC combination set(s) only.
See application file for complete search history.

(56) References Cited

U.S. PATENT DOCUMENTS

| 5,081,379 A | 1/1992 | Korteling | |
|---|---|---|---|
| 2016/0035867 A1* | 2/2016 | Pfirsch | .............. H01L 29/407 257/140 |
| 2016/0233788 A1 | 8/2016 | Osanai et al. | |

FOREIGN PATENT DOCUMENTS

DE  102011086129 A1  9/2012

OTHER PUBLICATIONS

Domes, Daniel et al., "IGBT-Module integrated Current and Temperature Sense based on Sigma-Delta Converter", PCIM Europe, International Exhibition & Conference for Power Electronics, Intelligent Motion, Power Quality, 2009.
Shen, Z. et al., "Comparative Study of Integrated Current Sensors in N-channel IGBTs", Proceedings of the 6th International Symposium on Power Semiconductor Devices & IC's, Davos, Switzerland, 1994, pp. 75-80.

* cited by examiner

*Primary Examiner* — Ratisha Mehta
(74) *Attorney, Agent, or Firm* — Murphy, Bilak & Homiller, PLLC

(57) ABSTRACT

A semiconductor device includes a plurality of forward conducting insulated-gate bipolar transistor cells configured to conduct a current in a forward operating mode of the semiconductor device and to block a current in a reverse operating mode of the semiconductor device. The semiconductor device also includes a plurality of reverse conducting insulated-gate bipolar transistor cells configured to conduct a current both in the forward operating mode and in the reverse operating mode. A corresponding method for operating a semiconductor device is also disclosed.

11 Claims, 14 Drawing Sheets

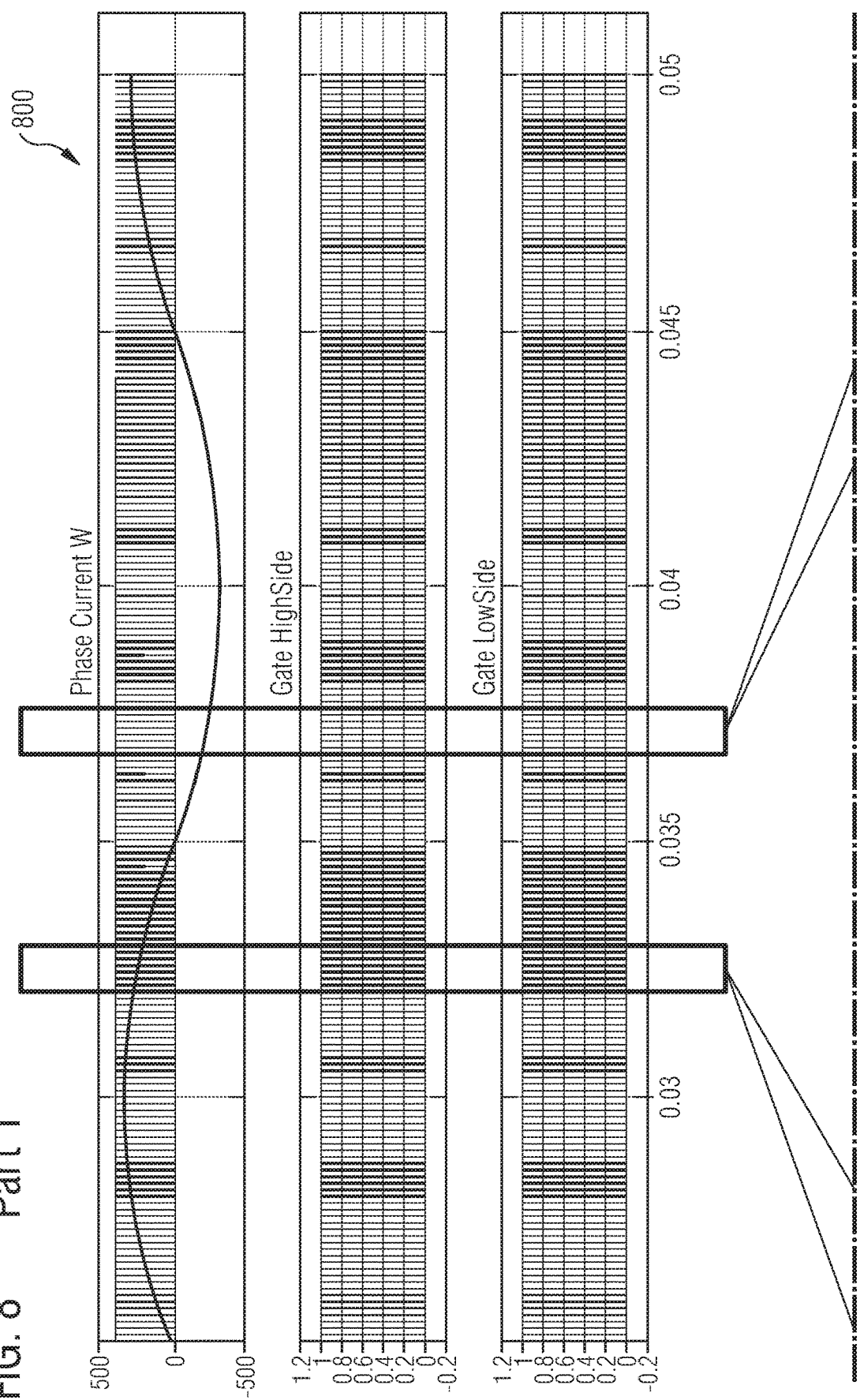
FIG. 8 Part 1

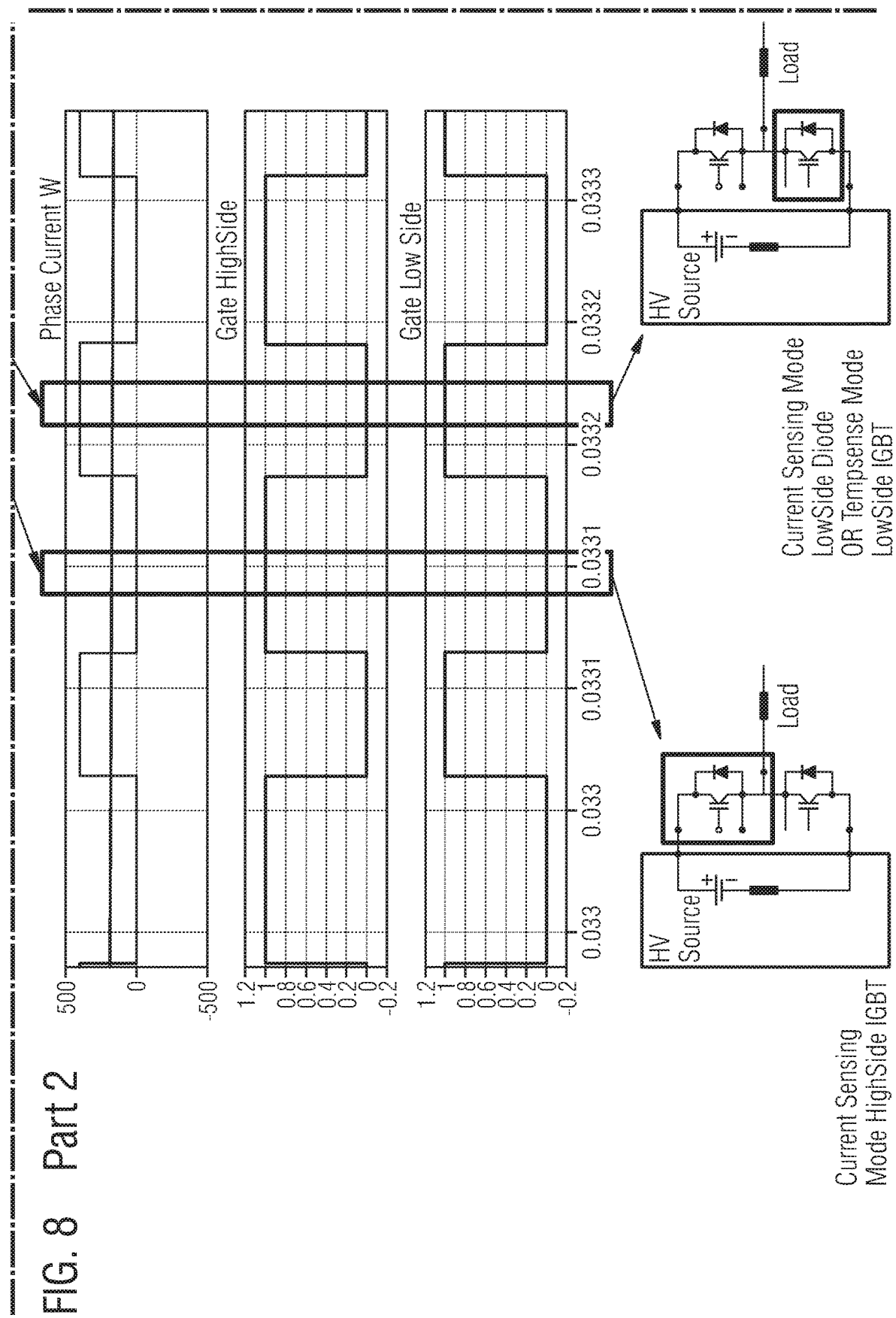
FIG. 8 Part 2

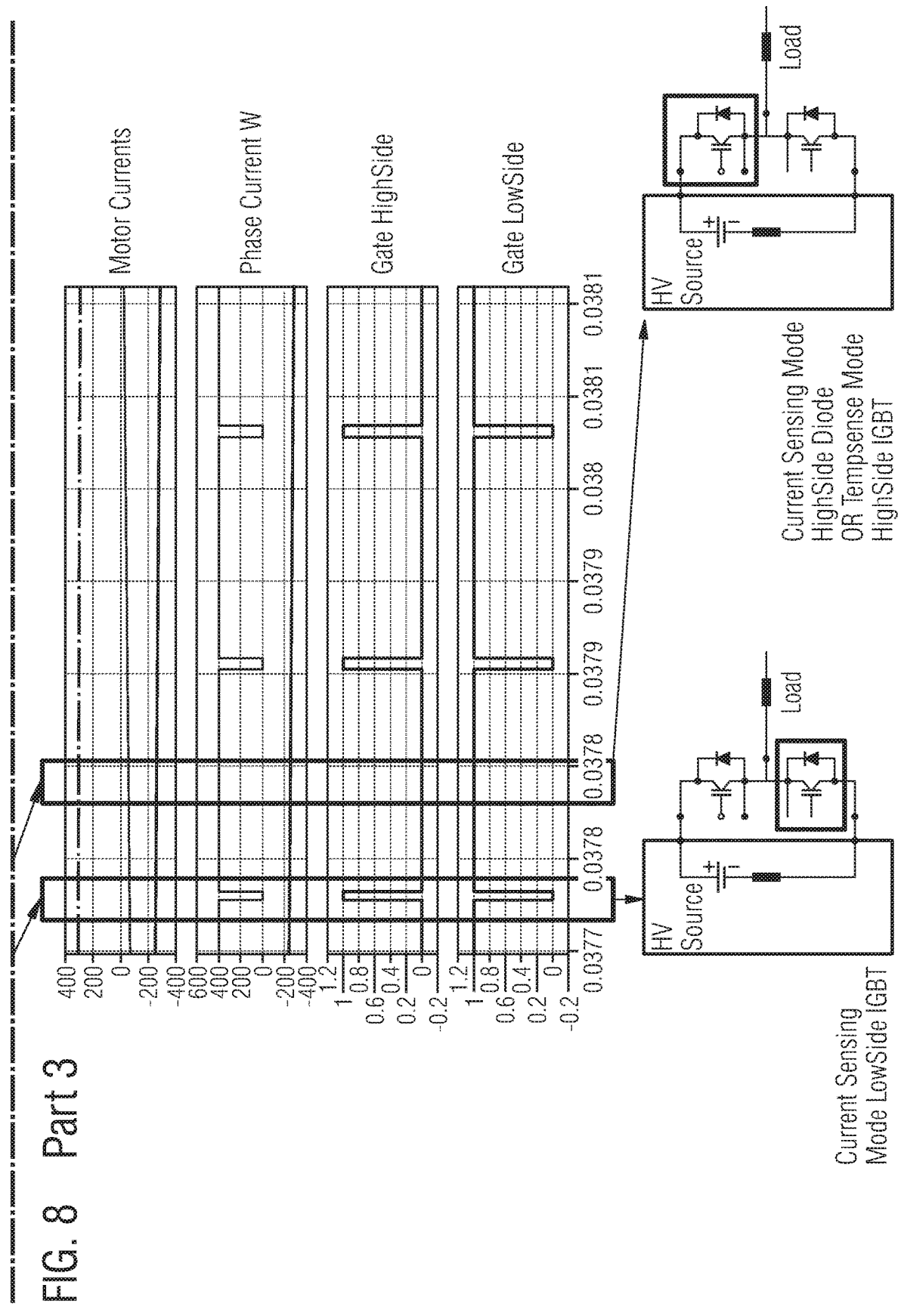

SEMICONDUCTOR DEVICES AND METHODS FOR OPERATING SEMICONDUCTOR DEVICES

TECHNICAL FIELD

Examples relate to semiconductor devices comprising insulate-gate bipolar transistor structures and methods for operating these semiconductor devices.

BACKGROUND

Over the last years growing interest has been drawn to power semiconductor devices. For example, advances in batteries and energy management as well as the need to reduce greenhouse gas emissions have intensified the research, development, and manufacturing of electric vehicles, such as electric cars or electricity-powered high speed trains. Other applications lie in the field of power generation, conversion, and distribution. For instance, highly efficient power semiconductor devices can increase the efficiency of electric generators used in power plants, but, on a smaller scale, can also extend battery recharge cycles of mobile devices. For these and further applications, highly efficient and low loss semiconductor devices are sought. Moreover, when operating power semiconductor devices, it is often desired to monitor their operation in order to operate them more reliably or to be able to take measures in case of failure. To compete on today's global markets, it is additionally important for semiconductor companies to reduce manufacturing efforts and costs of such semiconductor devices.

Hence, there is a desire to improve the efficiency of semiconductor devices and the reliability of their operation while maintaining low manufacturing efforts.

SUMMARY

Some embodiments relate to a semiconductor device comprising a plurality of forward conducting insulated-gate bipolar transistor cells. The plurality of forward conducting insulated-gate bipolar transistor cells is configured to conduct a current in a forward operating mode of the semiconductor device and to block a current in a reverse operating mode of the semiconductor device. Furthermore, the semiconductor device comprises a plurality of reverse conducting insulated-gate bipolar transistor cells. The plurality of reverse conducting insulated-gate bipolar transistor cells is configured to conduct a current both in the forward operating mode and in the reverse operating mode.

Some embodiments relate to an insulated-gate bipolar transistor device. The insulated-gate bipolar transistor device comprises a first transistor doping region of a first conductivity type and a second transistor doping region of a second conductivity type. The first transistor doping region and the second transistor doping region are arranged in a common semiconductor substrate of the insulated-gate bipolar transistor device. Furthermore, the insulated-gate bipolar transistor device comprises a collector electrode in contact with the first transistor doping region and the second transistor doping region at a backside surface of the semiconductor substrate. A contact area between the collector electrode and the first transistor doping region is larger than 70% of a total contact area between the collector electrode and the backside surface of the semiconductor substrate.

Some embodiments relate to a method for operating a semiconductor device. The method comprises coupling a resistor between a first emitter electrode and a second emitter electrode of the semiconductor device. The first emitter electrode is electrically connected to a plurality of forward conducting insulated-gate bipolar transistor cells of the semiconductor device. The second emitter electrode is electrically connected to a plurality of reverse conducting insulated-gate bipolar transistor cells of the semiconductor device. Furthermore, the method comprises conducting at least a fraction of a reverse current of the semiconductor device through the plurality of reverse conducting insulated-gate bipolar transistor cells during a reverse operating mode of the semiconductor device. Furthermore, the method comprises determining a voltage across the resistor during the reverse operating mode. Furthermore, the method comprises deriving a magnitude of the reverse current based on the voltage across the resistor.

BRIEF DESCRIPTION OF THE FIGURES

Some examples of apparatuses and/or methods will be described in the following by way of example only, and with reference to the accompanying figures, in which

FIG. 8 shows a single phase of a 3-phase sine modulated motor inverter application.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
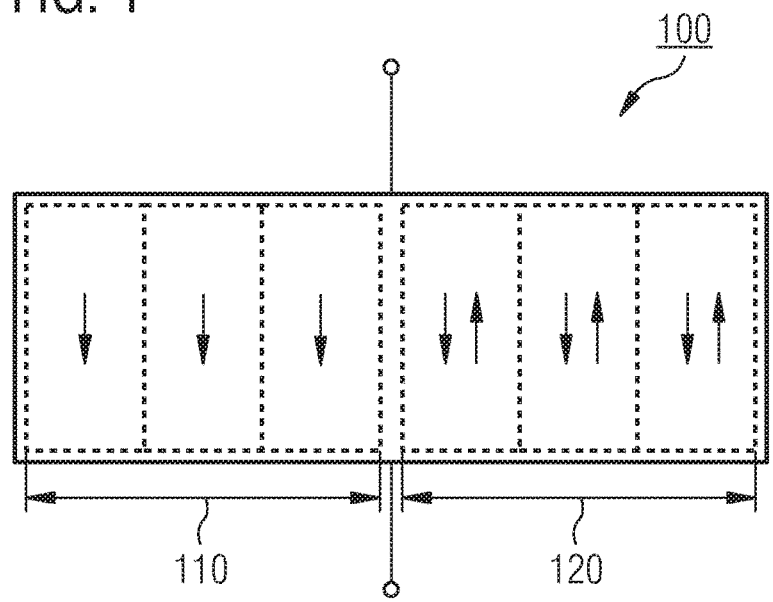
FIG. 1 shows a schematic illustration of a semiconductor device comprising a plurality of forward conducting insulated-gate bipolar transistor cells and a plurality of reverse conducting insulated-gate bipolar transistor cells.

FIG. 1 shows a schematic illustration of a semiconductor device 100. The semiconductor device 100 comprises a plurality 110 of forward conducting insulated-gate bipolar transistor cells. The plurality 110 of forward conducting insulated-gate bipolar transistor cells is configured to conduct a current in a forward operating mode of the semiconductor device 100 and to block a current in a reverse operating mode of the semiconductor device 100. Furthermore, the semiconductor device 100 comprises a plurality 120 of reverse conducting insulated-gate bipolar transistor cells. The plurality 120 of reverse conducting insulated-gate bipolar transistor cells is configured to conduct a current both in the forward operating mode and in the reverse operating mode.

The plurality 110 of forward conducting insulated-gate bipolar transistor cells (FC IGBT cells) can be employed for conducting a load current (or a fraction of a load current) of the semiconductor device 100 during the forward operating mode. The plurality 120 of reverse conducting insulated-gate bipolar transistor cells (RC IGBT cells) can be employed for measurement or monitoring tasks of the semiconductor device 100. Because an FC IGBT cell may comprise a lower electrical resistance (e.g., a lower emitter-collector resistance) than an RC IGBT cell during the forward operating mode, conducting the load current (or a fraction thereof) via the plurality 110 of FC IGBT cells may reduce an overall loss of the semiconductor device 100 during the forward operating mode, which may in turn improve the efficiency of the semiconductor device 100. Because the plurality 120 of RC IGBT cells may conduct a current both in the forward operating mode and in the reverse operating mode, the plurality 120 of RC IGBT cells can be employed for determining the load current (or a fraction thereof) flowing through the plurality 110 of FC IGBT cells during the forward operating and/or for determining a temperature of the semiconductor device 100. The determination of the temperature of the semiconductor device 100 may be performed during the reverse operating mode of the semiconductor device 100, for example. In this way, the semiconductor device 100 may operate at a high efficiency, while providing means for monitoring physical quantities of the semiconductor device 100.

In addition, the plurality 110 of FC IGBT cells and the plurality 120 of RC IGBT cells may be formed simultaneously during a manufacturing process of the semiconductor device 100 without increasing manufacturing efforts. This can reduce the manufacturing costs of the semiconductor device 100. For example, due to the usage of the plurality 120 of RC IGBT cells for monitoring the temperature of the semiconductor device 100, providing additional temperature sense diodes to the semiconductor device 100, which would increase the size and the manufacturing costs of the semiconductor device 100, can be avoided. The plurality 120 of RC IGBT cells may require less space within the semiconductor device 100 and fewer additional contact pads than additional temperature sense diodes.

A total number of FC IGBT cells of the semiconductor device 100 may be at least twice as large (or at least ten times as large, or at least a hundred times as large, or at least a thousand times as large, or at least ten-thousand times as large) as a total number of RC IGBT cells of the semiconductor device 100. In this way, there can be a majority of FC IGBT cells for conducting the load current (or a fraction thereof) of the semiconductor device 100 during the forward operating mode, such that losses of the semiconductor device 100 can be further decreased. Providing a majority of FC IGBT cells can also improve switching and blocking performance of the semiconductor device 100. Because for monitoring physical quantities of the semiconductor device 100, the plurality 120 of RC IGBT cells may operate at lower currents (e.g., conduct less current) than the plurality 110 of FC IGBT cells, the total number of RC IGBT cells may be lower than the total number of FC IGBT cells. For example, a maximum current flowing through the plurality 110 of FC IGBT cells may be larger than 1 A (or larger than 10 A, or larger than 100 A), whereas a maximum current flowing through the plurality 120 of RC IGBT cells may be smaller than 1 A (or smaller than 500 mA, or smaller than 100 mA, or smaller than 50 mA).

According to some embodiment, during the forward operating mode the plurality 120 of RC IGBT cells is configured to conduct at most 30% (or at most 10%, or at most 1%, or at most 0.10%, or at most 0.01%) of a total current through the semiconductor device 100. Additionally, the plurality 120 of RC IGBT cells may be configured to conduct at least a fraction of 1/500000 (one over five hundred thousand) of the total current through the semiconductor device 100 during the forward operating mode.

The magnitude of the current flowing through the plurality 120 of RC IGBT cells can be proportional to the magnitude of a current flowing through the plurality 110 of FC IGBT cells. The current flowing through the plurality 110 of FC IGBT cells can be larger than 70% (or larger than 90%, or larger than 99% or larger than 99.90%, or larger than 99.99%) of the total current through the semiconductor device 100 during the forward operating mode.

The magnitude of the current flowing through the plurality 120 of RC IGBT cells may then be measured (for example, via a voltage drop across an external resistor connected to the plurality 120 of RC IGBT cells) and be multiplied by a corresponding (first) coefficient of proportionality to determine the magnitude of the current flowing through the plurality 110 of FC IGBT cells and/or to determine the magnitude of the total current during the forward operating mode. The (first) coefficient of proportionality can be based on a ratio of a fraction of the total current flowing through the plurality 110 of FC IGBT cells to a fraction of the total current flowing through the plurality 120 of RC IGBT cells. This ratio can be predetermined by the design of the semiconductor device 100. For example, to conduct a larger fraction of the total current through the plurality 110 of FC IGBT cells, the total number of FC IGBT cells may be correspondingly larger than the total number of RC IGBT cells and/or a total lateral area (e.g., a lateral cross sectional area perpendicular to the current) of the plurality 110 of FC IGBT cells may be correspondingly larger than a total lateral area of the plurality 120 of RC IGBT cells.

During the reverse operating mode of the semiconductor device 100, the plurality 120 of RC IGBT cells can be configured to conduct at most 30% (or at most 10%, or at most 1%, or at most 0.10%, or at most 0.01%) of a total current through the semiconductor device 100. A second (remaining) fraction of the total current (e.g., a fraction larger than 70%, or larger than 90%, or larger than 99%, or larger than 99.90%, or larger than 99.99% of the total current) can, for example, flow through a diode (e.g., a freewheeling diode) comprised by the semiconductor device 100. This diode can be connected in parallel to the plurality 110 of FC IGBT cells. A first terminal of the diode can be coupled to an emitter electrode coupled to the plurality 110 of FC IGBT cells and a second terminal of the diode can be coupled to a collector electrode of the semiconductor device 100.

The magnitude of the current through the plurality 120 of RC IGBT cells may be measured (for example, via a voltage drop across an external resistor connected to the plurality 120 of RC IGBT cells) and be multiplied by a corresponding (second) coefficient of proportionality to determine the magnitude of the current flowing through the diode and/or to determine the total current during the reverse operating mode. The (second) coefficient of proportionality can be based on a ratio of the fraction of the total current flowing through the diode to the fraction of the total current flowing through the plurality 120 of RC IGBT cells during the reverse operating mode. This ratio can be predetermined by the design of the semiconductor device 100. For example, to conduct a larger fraction of the total current through the diode, a total lateral area of the diode may be correspondingly larger than the total lateral area of the plurality 120 of RC IGBT cells.

Alternatively to the diode for conducting the second (remaining) fraction of the total current through the semiconductor device 100 during the reverse operating mode, the semiconductor device 100 comprise an additional transistor element and/or an additional thyristor element connected in parallel to the plurality 110 of FC IGBT cells and configured to conduct current during the reverse operating mode and to block current during the forward operating mode.

The semiconductor device 100 (e.g., an insulated-gate bipolar transistor device, IGBT device) may comprise a plurality of repeating structures arranged laterally adjacent to each other within a semiconductor substrate of the semiconductor device 100. The smallest unit of the repeating structures can be referred to as a cell of the semiconductor device 100 (e.g., an FC IGBT cell or an RC IGBT cell). Such a cell may in itself comprise the functionality of a transistor, for example, of a forward conducting (FC) IGBT or a reverse conducting (RC) IGBT.

According to embodiments of the present disclosure (e.g., according to the semiconductor device 100), an FC IGBT cell and/or an RC IGBT cell may extend from a front side surface of the semiconductor substrate of the semiconductor device 100 to a backside surface of the semiconductor substrate. Furthermore, an FC IGBT cell and an RC IGBT cell may comprise different parts of doping regions and/or different doping regions of the semiconductor substrate. For example, an FC IGBT cell and/or an RC IGBT cell may comprise a part of a collector doping region of a first conductivity type, a part of a emitter doping region (or at least one emitter doping region) of a second conductivity type, a part of a body doping region of the first conductivity type, and a part of a drift doping region of the second conductivity type. Furthermore, an FC IGBT cell and/or an RC IGBT cell may comprise a gate electrode a part of a gate electrode) for controlling a current flow through the FC IGBT cell and/or through the RC IGBT cell, respectively.

Herein, a doping region can be understood as a continuous part of the semiconductor substrate in which the conductivity type remains the same. A doping concentration may however vary within a doping region. For example, the drift doping region can comprise a drift portion that may have a lower doping concentration then a field stop portion of the drift doping region. Moreover, a doping region may be bordered by doping regions of an opposite conductivity type and/or by other materials such as metals, insulation materials, polysilicon, mold material, or air, for example.

The part of the emitter doping region (or the emitter doping region) of an FC IGBT cell and/or of an RC IGBT cell can be contacted by an emitter electrode of the semiconductor device 100. For example, the semiconductor device 100 may comprise a first emitter electrode and a second emitter electrode. The first emitter electrode can be electrically connected to at least one of the plurality of forward conducting insulated-gate bipolar transistor cells (e.g., to a part of an emitter doping region or an emitter doping region of at least one FC IGBT cell). The second emitter electrode can be electrically connected to at least one of the plurality of reverse conducting insulated-gate bipolar transistor cells (e.g., to a part of an emitter doping region or an emitter doping region of at least one RC IGBT cell). The first emitter electrode may be electrically insulated from the second emitter electrode. According to some embodiments, the plurality 110 of FC IGBT cells is electrically connected to the first emitter electrode and the plurality 120 of RC IGBT cells is electrically connected to the second emitter electrode.

By providing a first and a second emitter electrode, an emitter current of an FC IGBT cell (or the plurality 110 of FC IGBT cells) can be distinguished and/or separated from an emitter current of an RC IGBT cell (or the plurality 120 of RC IGBT cells). For instance, the emitter current of the FC IGBT cell (or the plurality 110 of FC IGBT cells) may flow to a load of the semiconductor device 100 and the emitter current of the RC IGBT cell (or the plurality 120 of RC IGBT cells) may be used for measuring (e.g., deriving) physical quantities of the semiconductor device 100, such as the temperature of the semiconductor device 100 or the current of the FC IGBT cell(s).

Additionally, the second emitter electrode may be connected to at least one additional FC IGBT cell that is not connected to the first emitter electrode. Additional FC IGBT cells connected to the second emitter electrode may reduce losses during the forward operating mode and/or reduce cross talk between the FC IGBT cells connected to the first emitter electrode and the RC IGBT cells connected to the second emitter electrode during the reverse operating mode. For example, the additional FC IGBT cell(s) connected to the second emitter electrode may be arranged laterally between the FC IGBT cells connected to the first emitter electrode and the RC IGBT cells connected to the second emitter electrode.

The plurality 110 of FC IGBT cells and the plurality 120 of RC IGBT cells may be arranged in a common semiconductor substrate of the semiconductor device 100. This can reduce the size of the semiconductor device 100 and/or can enable measurements and/or deriving of physical quantities of the semiconductor device 100 and/or improve the accuracy of these measurements and/or derivations. For example, when using the plurality 120 of RC IGBT cells to measure a temperature of the semiconductor device 100, a measurement current may flow from the RC IGBT cells to the FC IGBT cells (or vice versa) within the semiconductor substrate of the semiconductor device 100 and may be used to derive a temperature of the semiconductor device 100.

Additionally, the plurality 110 of FC IGBT cells may laterally surround the plurality 120 of RC IGBT cells. When using at least the RC IGBT cells to derive a temperature of the semiconductor device 100, this can further improve the accuracy of temperature measurements, because the temperature at an inner part of the semiconductor substrate may be generally higher than at an edge of the semiconductor substrate. In an application, one is often interested in the highest temperature occurring in a semiconductor device. To this end, the plurality 120 of RC IGBT cells may be located at a geometrical center (or close to the geometrical center) of the semiconductor substrate while being laterally surrounded by the plurality 110 of FC IGBT cells.

Alternatively, the plurality 120 of RC IGBT cells may be located at an edge of the semiconductor substrate (e.g., a minimum distance from the plurality 120 of RC IGBT cells to an edge of the semiconductor substrate may be less than 5% of a maximal lateral extension of the semiconductor substrate). At the edge of the semiconductor substrate, the RC IGBT cells may be arranged laterally adjacent to each other. Towards a remaining part of the semiconductor substrate outside the plurality 120 of RC IGBT cells, the plurality 120 of RC IGBT cells may be laterally adjacent to the plurality 110 of FC IGBT cells. In other words, the plurality 120 of RC IGBT cells may be laterally adjacent to an edge of the semiconductor substrate and to the plurality 110 of FC IGBT cells.

For interconnections to external electric circuitry, a first emitter pad may be located vertically above the plurality 110 of FC IGBT cells on a top metallization layer of a wiring layer stack of the semiconductor device 100 and may be connected to the plurality 110 of FC IGBT cells via the first emitter electrode. Because the plurality 120 of RC IGBT cells can be located at an edge of the semiconductor substrate, a second emitter pad may be located vertically above the plurality 120 of RC IGBT cells on the top metallization layer and at an edge of the top metallization layer. This can enable connecting the first emitter pad to external electric circuitry by soldering (e.g., fully-area soldering) rather than by bonding. For example, a strip-shaped lead may be soldered to the first emitter pad. Such a lead can provide a lower electrical resistance than a bond wire or a plurality of bond wires, such that losses when operating the semiconductor device may be decreased.

An FC IGBT cell is configured to conduct a current in vertical direction through the semiconductor substrate during the forward operating mode of the semiconductor device 100 and is configured to block a current flowing in vertical direction through the semiconductor substrate (e.g., through the FC IGBT cell) during the reverse operating mode of the semiconductor device 100. A RC IGBT cell is configured to conduct a current in vertical direction through the semiconductor substrate both during the forward operating mode and during the reverse operating mode.

To this end, the semiconductor substrate of the semiconductor device 100 can comprise a collector doping region of the first conductivity type and a drift doping region of the second conductivity type. Within an FC IGBT cell, the collector doping region may separate the drift doping region from a backside surface of the semiconductor substrate. Within an RC IGBT cell, the drift doping region may extend vertically to the backside surface of the semiconductor substrate. A collector electrode of the semiconductor device 100 can be located at the backside surface of the semiconductor substrate. At the backside surface, the collector electrode may contact both the FC IGBT cell and the RC IGBT cell. In particular, concerning the FC IGBT cell, the collector electrode may be in contact with the part of the collector doping region located in the FC IGBT cell and is not in contact with the part of the drift doping region located in the FC IGBT cell. Concerning the RC IGBT cell, the collector electrode may be in contact with the part of the collector doping region located in the RC IGBT cell as well as the part of the drift doping region located in the RC IGBT cell.

In the reverse operating mode, a pn-junction existing between the collector doping region and the drift doping region may be reversed biased (or unbiased). Due to the collector doping region separating the drift doping region within an FC IGBT cell from the backside surface of the semiconductor substrate, said pn-junction may block a current of the semiconductor device 100 (e.g., an emitter-collector current or a fraction thereof) from flowing between the collector electrode and the (first) emitter electrode through the FC IGBT cell during the reverse operating mode. Because the collector electrode is in contact with the drift doping region at a part of the backside surface of the semiconductor substrate located in an RC IGBT cell, the emitter-collector current (or a fraction thereof) may flow through the RC IGBT cell during the reverse operating mode. This may be possible, because within the RC IGBT cell the emitter-collector current (or the fraction thereof) might not have to cross the pn-j unction existing between the collector doping region and the drift doping region. Hence, during the reverse operating mode, the emitter-collector current (or the fraction thereof) may flow between the collector electrode and the (second) emitter electrode through the RC IGBT cell.

During the forward operating mode the pn-junction between the collector doping region and the drift doping region may be forward biased, such that the emitter-collector current (or a fraction thereof) may flow through an FC IGBT cell (as well as through an RC IGBT cell).

Figure 2A:
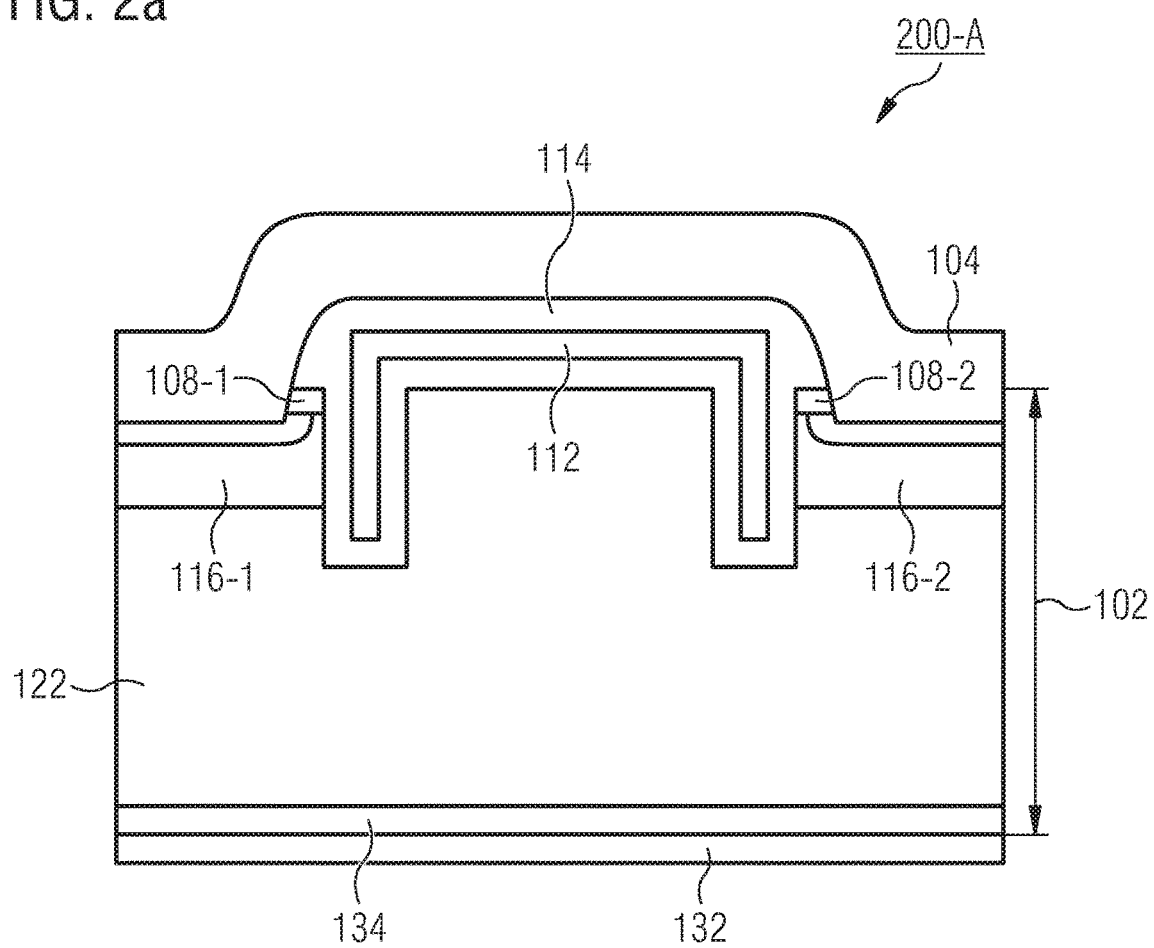
FIG. 2a shows a schematic cross section of a forward conducting insulated-gate bipolar transistor cell.

FIG. 2a shows a schematic cross section of an FC IGBT cell 200-A. The FC IGBT cell 200-A illustrates an example for a forward conducting IGBT cell of the semiconductor device 100 explained in the context of FIG. 1. The scope of the present disclosure is however not limited to the FC IGBT cell 200-A of FIG. 2a. Various implementations of FC IGBT cells are possible.

The FC IGBT cell 200-A extends from a front side surface of a semiconductor substrate 102 to a backside surface of the semiconductor substrate 102. The FC IGBT cell 200-A comprises a part of a collector doping region 134 of the first conductivity type. A collector electrode 132 is located vertically adjacent to the backside surface of the semiconductor substrate 102 and contacts the part of the collector doping region 134 comprised by the FC IGBT cell 200-A. Furthermore, the FC IGBT cell 200-A comprises a part of a drift doping region 122 of the second conductivity type. Within the FC IGBT cell 200-A (or within each of the plurality of FC IGBT cells of at least some embodiments of this disclosure), the collector doping region 134 is located vertically between the drift doping region 122 and the backside surface of the semiconductor substrate 102, so that, within the FC IGBT cell 200-A, the drift doping region 122 does not extend to the backside surface of the semiconductor substrate 102. Hence, during a reverse operating mode of a semiconductor device (e.g., the semiconductor device 100 of FIG. 1) comprising the FC IGBT cell 200-A, the FC IGBT cell may block a current from flowing through it.

For example, within the FC IGBT cell 200-A (or within each of the plurality of IGBT cells of at least some embodiments of this disclosure), a minimum vertical distance from the drift doping region to the backside surface of the semiconductor substrate and/or to the collector electrode may be larger than 100 nm (or larger than 500 nm, or larger than 2 μm, or larger than 5 μm).

As indicated by the different shadings of the drift doping region 122, the drift doping region 122 may comprise a more heavily doped part (e.g., a field stop layer and/or a buffer layer) as represented in FIG. 2a by the shaded part of the drift doping region 122 located at an interface with the collector doping region 134. Furthermore, the drift doping region 122 may comprise a more lightly doped part (e.g., a drift part) as represented in FIG. 2a by the bright part of the drift doping region 122 located vertically above the shaded part of the drift doping region 122.

Moreover, the exemplary FC IGBT cell 200-A comprises a part of a first body doping region 116-1 and a part of a second body doping region 116-2 of the semiconductor substrate 102. The part of first and the part of the second body doping region 116-1, 116-2 can be of the first conductivity type. The part of the first body doping region 116-1 is located vertically between a first emitter doping region 108-1 of the FC IGBT cell 200-A and the part of the drift doping region 122 of the FC IGBT cell 200-A. The part of the second body doping region 116-2 is located vertically between a second emitter doping region 108-2 of the FC IGBT cell 200-A and the part of the drift doping region 122 of the FC IGBT cell 200-A. The first and the second emitter doping region 108-1, 108-2 can be of the second conductivity type.

Additionally, the FC IGBT cell 200-A comprises at least a part of a gate electrode 112. The part of the gate electrode 112 comprises two gate-plates extending vertically into the semiconductor substrate 102 and being insulated from the semiconductor substrate 102 by insulation material 114. One of the gate plates is located laterally adjacent to the first emitter doping region 108-1 and the part of the first body doping region 116-1. The other one of the gate plates is located laterally adjacent to the second emitter doping region 108-2 and the part of the second body doping region 116-2. During a forward operating mode of the semiconductor device, a pn-j unction between the first body doping region 116-1 and the drift doping region 122 as well as a pn-junction between the second body doping region 116-2 and the drift doping region 122 may be reversed biased. The application of a gate voltage larger than a threshold voltage of the semiconductor device to the gate electrode 112 may however induce a conductive channel within the part of the first body doping region 116-1 and the part of the second 116-2, so that a current (e.g., a emitter-collector current or forward current of the semiconductor device or a fraction thereof) may flow through the FC IGBT cell between the collector electrode 132 and a (first) emitter electrode 104 of the semiconductor device. The (first) emitter electrode 104 contacts the FC IGBT cell at a front side surface of the semiconductor substrate 102 and is in contact with the first emitter doping region 108-1 and the part of the first body doping region 116-1 as well as with the second emitter doping region 108-2 and the part of the second body doping region 116-2.

Within a common semiconductor substrate, a neighboring FC IGBT cell and/or a neighboring RC IGBT cell laterally adjacent to the FC IGBT cell 200-A may comprise another part of the collector doping region laterally adjacent to the part of the collector doping region 134 comprised by the FC IGBT cell 200-A. Furthermore, the neighboring FC IGBT cell and/or the neighboring RC IGBT cell may comprise another part of the drift doping region 122 laterally adjacent to the part of the drift doping region 122 comprised by the FC IGBT cell 200-A. Furthermore, the neighboring FC IGBT cell and/or the neighboring RC IGBT may comprise another part of the first body doping region 116-1 (or of the second body doping region 116-2) laterally adjacent to the part of the first body doping region 116-1 (or of the second body doping region 116-2, respectively) comprised by the FC IGBT cell 200-A.

Figure 2B:
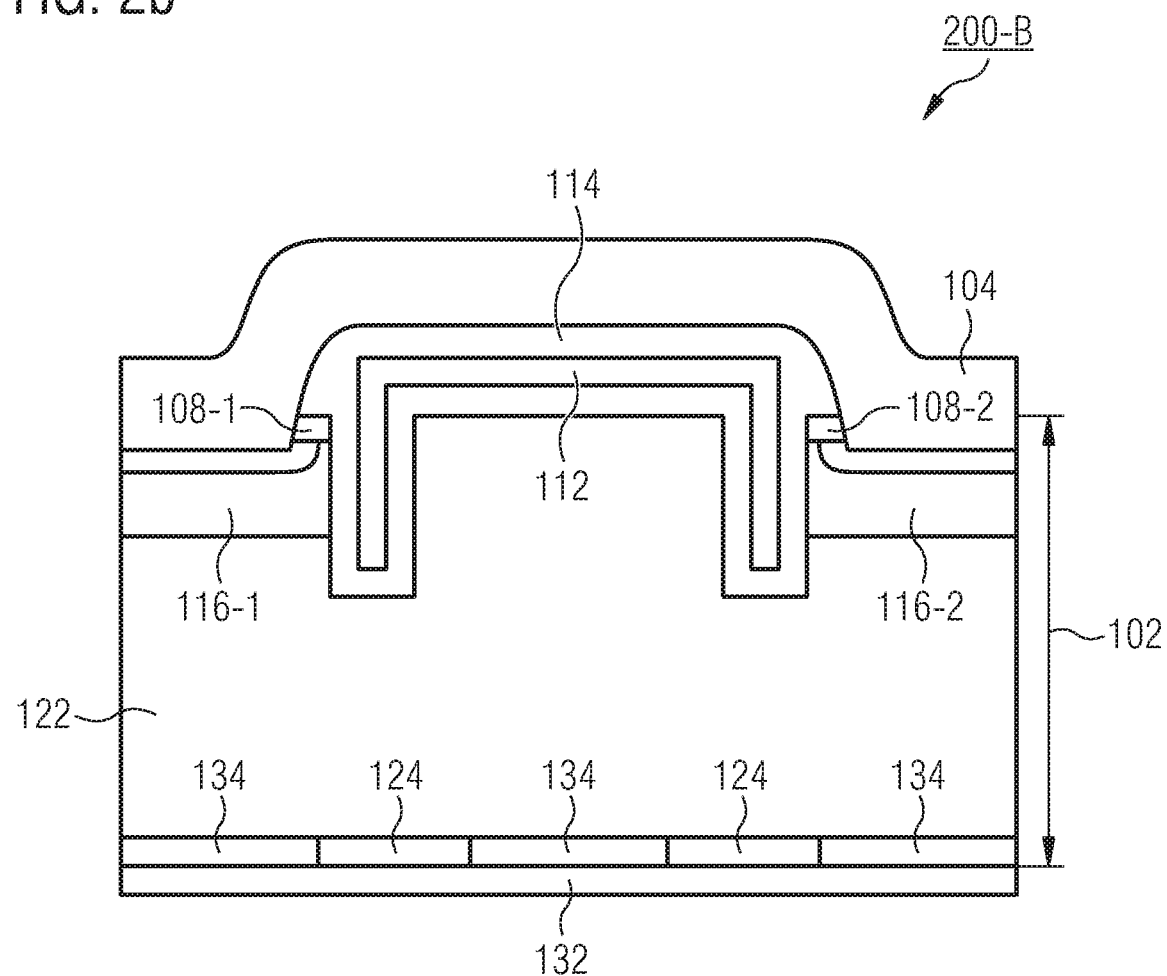
FIG. 2b shows a schematic cross section of a reverse conducting insulated-gate bipolar transistor cell.

FIG. 2b shows a schematic cross section of an RC IGBT cell 200-B. The RC IGBT cell 200-B illustrates an example for a reverse conducting IGBT cell of the semiconductor device 100 explained in the context of FIG. 1. The scope of the present disclosure is however not limited to the RC IGBT cell 200-B of FIG. 2b. Various implementations of RC IGBT cells are possible.

The RC IGBT cell 200-B may be arranged in a common semiconductor substrate 102 together with the FC IGBT cell 200-A of FIG. 2a. In comparison with the FC IGBT cell 200-A, the RC IGBT cell 200-B comprises a part of the drift doping region 122 of the semiconductor substrate 102 extending to the backside surface of the semiconductor substrate 102. At the backside surface of the semiconductor substrate 102, the part of the drift doping region 122 of the RC IGBT cell 200-B is in contact with the collector electrode 132. A doping concentration of the drift doping region 122 may be maximal at the backside surface of the semiconductor substrate 102 as indicated by the dark shadings 124 of the drift doping region 122 in FIG. 2b. Within the RC IGBT cell 200-B, the drift doping region 122 is in contact with collector electrode 132 at two different interface areas separated by a portion of the collector doping region 134. Alternatively, the part of the drift doping region 122 of an RC IGBT cell may be in contact with the collector electrode 132 at just one interface area or at multiple interface areas (e.g., more than two interface areas). In other words, within the RC IGBT cell 200-B (e.g., within at least one RC IGBT cell of at least some embodiments of this disclosure), the collector doping region 134 and the drift doping region 124 extend laterally at the backside surface of the semiconductor substrate 102. Additionally, within the RC IGBT cell 200-B, the collector doping region 134 may laterally surround the drift doping region 122 at the backside surface of the semiconductor substrate 102, such that at the backside surface of the semiconductor substrate 102 the drift doping region does not extend to the lateral limits of RC IGBT cell 200-B. This can reduce cross talk between RC IGBT cells and FC IGBT cells arranged in a common semiconductor substrate.

Figure 2C:
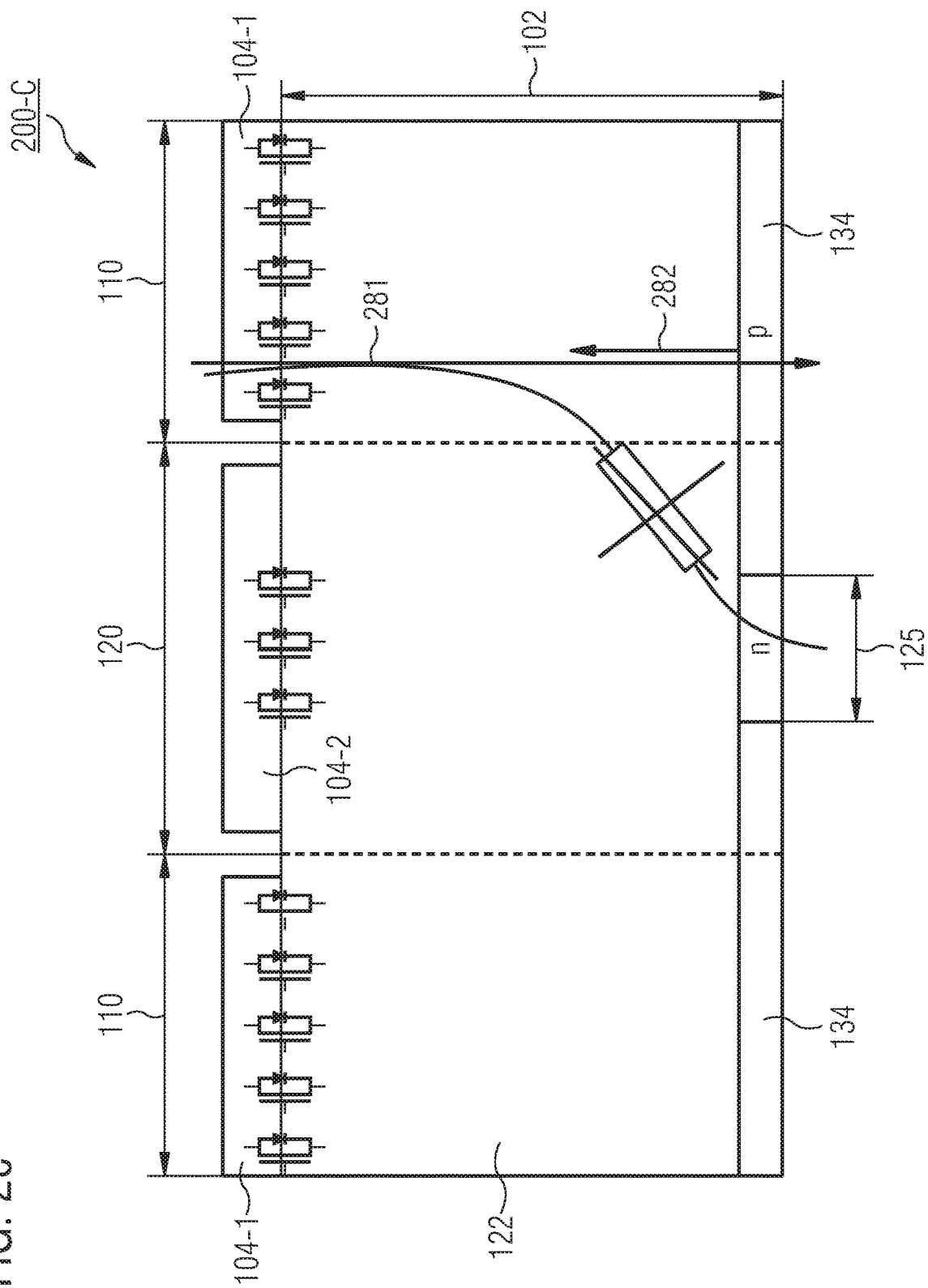
FIG. 2c shows a schematic cross section of a semiconductor device comprising a plurality of forward conducting insulated-gate bipolar transistor cells and a plurality of reverse conducting insulated-gate bipolar transistor cells arranged in a common semiconductor substrate.

For further illustration of how to reduce of cross talk, FIG. 2c shows a schematic cross section of a semiconductor device 200-C comprising a plurality 110 of FC IGBT cells and a plurality 120 of RC IGBT cells arranged in a common semiconductor substrate 102 of the semiconductor device 200-C. For sake of a simplified illustration body doping regions and emitter doping regions of the semiconductor substrate 102 are not shown in FIG. 2c, The individual cells of the plurality 110 of FC IGBT cells and of the plurality 120 of RC IGBT cells are indicated by schematic symbols of field effect transistors.

The plurality 110 of FC IGBT cells is contacted by a first emitter electrode 104-1 and the plurality 120 of RC IGBT cells is contacted by a second emitter electrode 104-2. In an application, the first emitter electrode 104-1 may be connected to a load source, the second emitter electrode 104-2 may be connected to a current sense source. Moreover, in the example of the semiconductor device 200-C, the drift doping region 122 is n-doped and the collector doping region 134 is p-doped. During a forward operating mode of the semiconductor device 200-C an electron current 281 may flow within each FC IGBT cell from the first emitter electrode 104-1 into the part of the drift doping region 122 comprised by the plurality 110 of FC IGBT cells. To prevent cross talk between the plurality 110 of FC IGBT cells and the plurality 120 of RC IGBT cells, it is desired that this electron current 281 flows into the part of the collector doping region 134 comprised by the plurality 110 of FC IGBT cells. A corresponding hole current 282 can then be injected from the part of the collector doping region 134 comprised by the plurality 110 of FC IGBT cells into the part of the drift doping region 122 comprised by the plurality 110 of FC IGBT cells.

To prevent the electron current 281 from flowing via the part of the drift doping region 122 comprised by the plurality 120 of RC IGBT cells to the collector electrode (which causes cross talk between the FC IGBT cells and RC IGBT cells) the interface area between the drift doping region 122 and a collector electrode (not shown in FIG. 2c) of the semiconductor device 200-C may be located laterally sufficiently apart from the plurality 110 of FC IGBT cells.

To this end, according to at least some embodiments of this disclosure, a minimum lateral distance along the backside surface of the semiconductor substrate 102 from any of the plurality 110 of FC IGBT cells to a portion of the drift doping region 122 located at the backside surface of the semiconductor substrate 102 may be larger than 1 µm (or larger than 2 µm, or larger than 5 µm, or larger than 10 µm). In this way, cross talk between RC IGBT cells and FC IGBT cells during the forward (and/or the reverse operating mode) of the semiconductor device may be reduced and/or avoided.

In other words, for the design (of the semiconductor device 200-C) an opening of the p collector (e.g., the part of the collector doping region 134 comprised by the plurality 120 of RC IGBT cells) below the current sense pad (e.g., the second emitter electrode 104-2) may be small enough to prevent cross talk. To this end, it may be desired to assure the ignition of substrate p collector also for the load cells (e.g., FC IGBT cells) adjacent to the current sense cells (e.g., RC IGBT cells).

For a reduction of cross talk and/or because the total number of FC IGBT cells may be higher than the total number of RC IGBT cells of a semiconductor device (e.g., the semiconductor device 100 of FIG. 1), the drift doping region 122 may occupy less than 30% (or less than 10%, or less than 1%, or less than 0.10%, or less than 0.01%) of the backside surface of the semiconductor substrate 102.

A single IGBT cell, for example, the RC IGBT cell 200-B, may comprise means to conduct a current vertically through a semiconductor substrate during a forward and a reverse operating mode and to block a current from flowing vertically through the semiconductor substrate during a blocking operating mode of a semiconductor device comprising the RC IGBT cell. However, according to at least some embodiments, the plurality 120 of RC IGBT cells may as a whole be configured to conduct a current vertically through the semiconductor substrate 102 both during the forward and the reverse operating mode and to block a current from flowing vertically through the semiconductor substrate 102 during the blocking operating mode of the semiconductor device.

For example, the plurality 120 of RC IGBT cells of the semiconductor device 200-C is connected to a second emitter electrode 104-2 of the semiconductor device 200-C. A first subset of the plurality 120 of RC IGBT cells may then be configured for conducting a current vertically through the semiconductor substrate 102 during the forward operating mode and to block a current from flowing vertically through the semiconductor substrate 102 during the reverse operating mode. For example, within the first subset of the plurality 120 of RC IGBT cells the collector doping region 134 may separate the drift doping region 122 from the backside surface of the semiconductor substrate 102 and thus from the collector electrode.

On the other hand, a second subset of the plurality 120 of RC IGBT cells may be configured for conducting a current vertically through the semiconductor substrate 102 during the forward and the reverse operating mode. To this end, the second subset of the plurality 120 of RC IGBT cells may exclude the collector doping region 134, so that the drift doping region may extend laterally across the backside surface of the semiconductor substrate 102 within the RC IGBT cells of the second subset. In other words, the IGBT cells of the first subset of the plurality 120 of RC IGBT cells may comprise a structure corresponding to the FC IGBT cell 200-A of FIG. 2a, while the IGBT cells of the second subset of the plurality 120 of RC IGBT cells may comprise a structure corresponding to the structure of a double-diffused metal-oxide semiconductor field effect transistor cell (DMOSFET cell). Hence, the collector doping region 134 may extend laterally at the backside surface of the semiconductor substrate 102 within at least one reverse conducting insulated-gate bipolar transistor cell.

According to an exemplary implementation of the semiconductor device 200-C, at least some of the plurality 120 of RC IGBT cells are arranged laterally adjacent to each other. A maximum width of the drift doping region 122 at the backside surface of the semiconductor substrate 102 may be larger than a cell pitch of the adjacently arranged RC IGBT cells. This can allow a larger maximum width of the drift doping region 122 at the backside surface of the semiconductor substrate 102 and thus ease the manufacturing process and/or manufacturing tolerances of the semiconductor device 200-C. A cell pitch of the adjacently arranged RC IGBT cells may correspond to the width of an RC IGBT cell.

For example, the maximum width of the drift doping region 122 at the backside surface of the semiconductor substrate 102 may be larger than the total width of the adjacently arranged RC IGBT cells as long as a minimum lateral distance along the backside surface of the semiconductor substrate from any of the plurality 110 of FC IGBT cells to a portion of the drift doping region located at the backside surface of the semiconductor substrate is larger than 1 μm. To this end, a portion of the semiconductor substrate 102 that is neither occupied by RC IGBT cells nor by FC IGBT cells may be arranged laterally between the plurality 120 of RC IGBT cells and the plurality 110 of FC IGBT cells.

Alternatively, the maximum width of the drift doping region 122 at the backside surface of the semiconductor substrate 102 may be smaller than the total width of the adjacently arranged RC IGBT cells. For example, the maximum width of the drift doping region 122 at the backside surface of the semiconductor substrate 102 may be smaller than 90% (or smaller than 75%, or smaller than 50%, or smaller than 30%) of the total width of the adjacently arranged. RC IGBT cells.

Herein, the maximum width of the drift doping region 122 at the backside surface of the semiconductor substrate 102 may correspond to the maximum width of an interface area of the drift doping region 122 with the collector electrode 132. A length of the drift doping region 122 (e.g., a lateral extension of the drift doping region 122 perpendicular to the cross sections shown in FIGS. 2b-c) at the backside surface of the semiconductor substrate 102 may be larger than the maximum width of the drift doping region 122 at the backside surface of the semiconductor substrate 102.

Additionally, within the adjacently arranged. RC IGBT cells the collector doping region 134 may laterally surround the drift doping region 122 at the backside surface of the semiconductor substrate 102. This is shown in FIG. 2c and may reduce cross talk between the plurality 120 of RC IGBT cells and the plurality 110 of FC IGBT cells.

Turning back again to FIG. 2b, the collector doping 132 region and the drift doping region 122 extend laterally at the backside surface of the semiconductor substrate 102 within the RC IGBT cell 200-B. In the forward operating mode of a semiconductor device comprising the RC IGBT cell 200-B, the collector doping region 132 may reduce a collector-emitter resistance of the RC IGBT cell 200-B. However, the FC IGBT cell 200-A of FIG. 2a may comprise a lower collector-emitter resistance than the RC IGBT cell 200-B during the forward operating mode, because within the FC IGBT cell 200-A the collector doping region 132 may extend over the (entire) backside surface of the FC IGBT cell 200-A.

Due to this reason, an exemplary semiconductor device may comprise a higher total number of FC IGBT cells than of RC IGBT cells. The FC IGBT cells can then be employed for conducting a load current (e.g., forward current) of the semiconductor device during the forward operating mode, whereas the RC IGBT cells may be used for measuring physical quantities of the semiconductor device (e.g., the load current and/or a temperature of the semiconductor device). Because for such measurement tasks a current much lower than the load current may flow through the plurality of RC IGBT cells (e.g., less than 1%, or less than 0.10%, or less than 0.01% of the load current), losses due to an increased collector-emitter resistance of the RC IGBT cells may only slightly contribute to the overall losses of the semiconductor device. On the other hand, because of the dominating number of FC IGBT cells with a lower collector-emitter resistance during the forward operating mode, the overall losses of the semiconductor device may be reduced compared to other reverse conducting IGBT devices.

In order to conduct a load current (e.g., a reverse current) during the reverse operating mode (or in order to reduce losses of the semiconductor device during the reverse operating mode), the semiconductor device 100 may additionally comprise a diode. The diode can be external to both the plurality of FC IGBT cells and the plurality of RC IGBT Moreover, the diode can be configured to conduct at least 70% (or at least 80%, or at least 90%, or at least 99%, or at least 99.90%, or at least 99.99%) of a total current (e.g., a total reverse current) through the semiconductor device 100 during the reverse operating mode. The diode may be a freewheeling diode, for example.

To conduct such a high fraction of the total current during the reverse operating mode, a lateral area of the diode (e.g., a cross section of the diode parallel to the front side surface of a semiconductor substrate of the diode and perpendicular to a current direction through the diode) can be dimensioned to be correspondingly larger than a total lateral area of the plurality of RC IGBT cells. For example, when the diode is configured to conduct 70% of a total current during the reverse operating mode, the plurality of RC IGBT cells may be configured to conduct the remaining 30% of the total current. The lateral area of the diode may then be larger by a factor of about 7/3 compared to the total lateral area of the plurality of RC IGBT cells.

The diode may comprise a semiconductor substrate separated from a common semiconductor substrate of the plurality of FC IGBT cells and the plurality of RC IGBT cells. The diode may then be integrated into a common semiconductor package together with the common semiconductor substrate of the plurality of FC IGBT cells and the plurality of RC IGBT cells. Alternatively, the diode can be arranged in another part of the common semiconductor substrate of the plurality of FC IGBT cells and the plurality of RC IGBT cells.

According to some embodiments, the semiconductor substrate may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate. The semiconductor substrate may be a semiconductor wafer or a semiconductor die.

The front side surface of the semiconductor substrate may be the surface used to implement more sophisticated and complex structures than at the backside surface, since the process parameters temperature) and the handling may be limited for the backside surface, if structures are already formed at one side of the semiconductor substrate, for example.

Vertical directions, vertical dimensions (e.g., depths), thicknesses of regions, parts of regions, and/or of layers, and thicknesses of structures may, for example, be measured orthogonal to the backside surface of the semiconductor substrate. Lateral directions and lateral dimensions (e.g., lengths and widths) may be measured in parallel to the backside surface of the semiconductor substrate. If it is referred to a length and/or to a width of a region, of a part of a region, of an area, of a structure and/or of a layer, the length designates the longer lateral dimension and the width designates the shorter lateral dimension of the structure and/or of the layer, for example.

A region comprising the first conductivity type may be a p-doped region (e.g. caused by incorporating aluminum ions or boron ions, for example) or an n-doped region (e.g. caused by incorporating nitrogen ions, phosphor ions or arsenic ions, for example). Consequently, the second conductivity type indicates an opposite n-doped region or p-doped region, respectively. In other words, the first conductivity type may indicate a p-doping and the second conductivity type may indicate an n-doping or vice-versa.

Figure 3A:
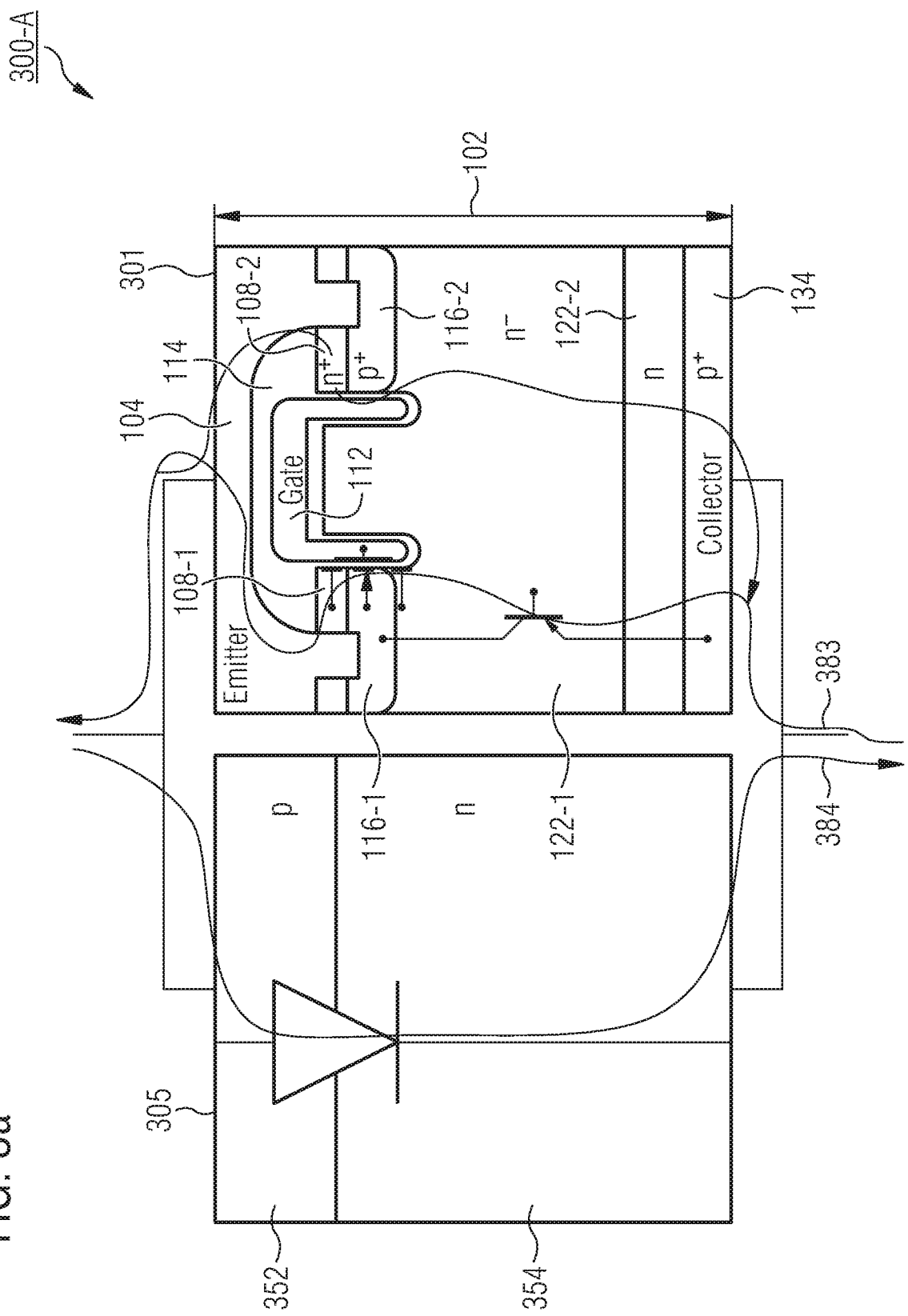
FIG. 3a shows a schematic cross section of an assembly of a forward conducting insulated-gate bipolar transistor cell and a diode connected in parallel.

FIG. 3a shows a schematic cross section of an assembly 300-A of an FC IGBT cell 301 and a diode 350 connected in parallel to the FC IGBT cell 301. The assembly 300-A may comprise additional FC IGBT cells and/or additional RC IGBT cells. The FC IGBT cell 301 may be similar to the FC IGBT cell 200-A of FIG. 2a. In the example of FIG. 3a, the first conductivity type is p and the second conductivity type is n. Moreover, a drift doping region of the FC IGBT cell 301 comprises a drift part 122-1 and a field stop part 122-2. (or field stop layer) that is vertically arranged between the drift part 122-1 and a collector doping region 134 of the FC IGBT cell 301. The field stop part 122-2 comprises a higher maximal doping than the drift part 122-1.

The diode 350 comprises a first diode doping region 352 of the first conductivity type and a second diode doping region 354 of the second conductivity type. The first diode doping region 352 forms a pn-junction with the second diode doping region 354. The first diode doping region 352 is electrically connected to an emitter electrode 104 of the FC IGBT cell 301. The second diode doping region 354 is electrically connected to a collector electrode (not shown in FIG. 3a) of the FC IGBT cell 301.

During a forward operating mode of a semiconductor device comprising the assembly 300-A, the collector electrode may be at a higher electric potential than the emitter electrode 104 and a voltage applied to a gate electrode 112 of the FC IGBT cell may be higher than a threshold voltage (e.g., a gate-emitter threshold voltage) of the FC IGBT cell 301. In this way, a forward current 383 (e.g., a load current) may flow from the collector electrode via the pn-junction of the collector doping region 134 with the drift doping region and via conductive channels through a first and a second body doping region 116-1, 116-2 of the FC IGBT cell 301 to the emitter electrode 104. The pn-junction of the diode 350 may be reversed biased during the forward operating mode, so that the diode 350 may block currents from flowing through it during the forward operating mode.

During a reverse operating mode of the semiconductor device comprising the assembly 300-A, the emitter electrode 104 may be at a higher electric potential than the collector electrode. The pn-junction between the collector doping region 134 and the drift doping region may hence be reversed biased, while the pn-junction of the diode 350 may be forward biased. Thus, a reverse current 384 may flow from the emitter electrode (or from a wiring element connected to the emitter electrode) via the diode 350 to the collector electrode (or to a wiring element connected to the collector electrode).

In a blocking operating mode of the FC IGBT cell 301, the collector electrode may be at a higher electric potential than the emitter electrode 104. The voltage applied to the gate electrode 112 of the FC IGBT cell may be smaller than the threshold voltage of the FC IGBT cell 301. Thus, neither in the first nor in the second body doping region 116-1, 116-2 a conductive channel may be induced, so that a current may be blocked from flowing through the FC IGBT cell 301 during the blocking operating mode. Because of the diode 350 being reverse biased during the blocking operating mode, a current may also be blocked from flowing through the diode 350.

Of course, the FC IGBT cell 301 and the diode 350 may also be complementarily doped, meaning that the first conductivity type may be n, and the second conductivity type may be p. The voltages applied to the assembly 300-A for the different operating modes may then be of reversed polarities resulting in reversed current directions.

Figure 3B:
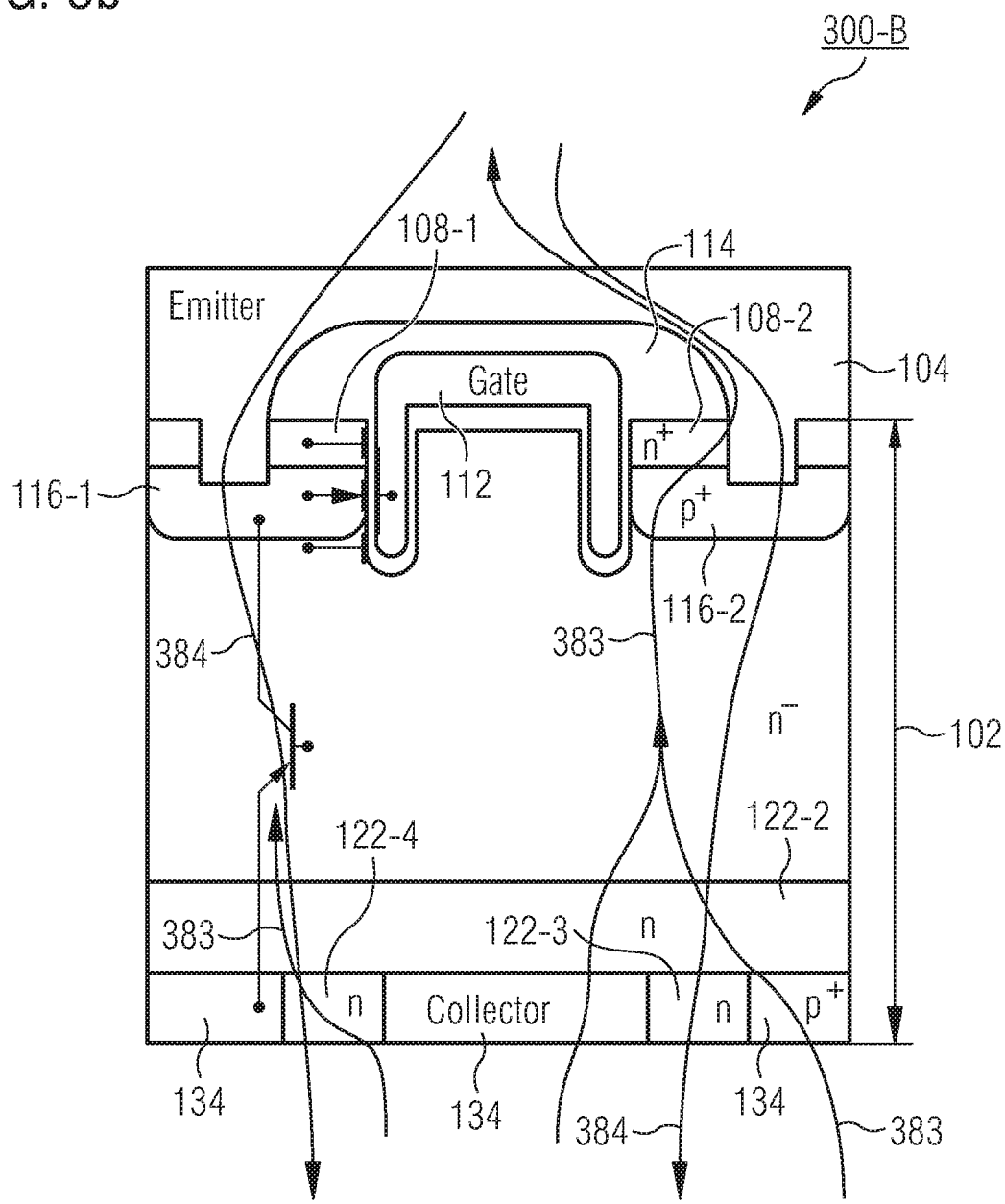
FIG. 3b shows a schematic cross section of another reverse conducting insulated-gate bipolar transistor cell with indicated current directions during a forward and a reverse operating.

FIG. 3b shows a schematic cross section of another RC IGBT cell 300-B. The RC IGBT cell 300-B may be similar to the RC IGBT cell 200-B of FIG. 2b. Moreover, the RC IGBT cell 300-B (or a plurality thereof) may be arranged in a common semiconductor substrate 102 together with one or more FC IGBT cells 301 of FIG. 3a. In the exemplary RC IGBT cell 300-B the first conductivity type is p and the second conductivity type is n.

The RC IGBT cell 300-B comprises at least a part of a drift doping region of the semiconductor substrate 102. Within the RC IGBT cell 300-B, there are two portions 122-3, 122-4 of the drift doping region located at a backside surface of the semiconductor substrate 102. The two portions 122-3, 122-4 of the drift doping region located at the backside surface of the semiconductor substrate 102 may comprise a higher maximal doping concentration then a field stop part 122-2 and/or a drift part 122-1 of the drift doping region. Furthermore, the RC IGBT cell 300-B comprises at least a part of a collector doping region 134 of the semiconductor substrate 102, which is located at the backside surface of the semiconductor substrate 102. The part of the collector doping region 134 comprised by the RC IGBT cell 300-B as well as the two portions of the drift doping region 122-3, 122-4 may be in contact with a collector electrode at the backside surface of the semiconductor substrate 102.

During a forward operating mode and/or during a blocking operating mode of a semiconductor device comprising the RC IGBT cell 300-B, the collector electrode may be at a higher electric potential than a (second) emitter electrode 104 of the semiconductor device contacting the RC IGBT cell 300-B. During a blocking operating mode, a voltage applied to a gate electrode 112 of the RC IGBT cell may be lower than a threshold voltage (e.g., a gate-emitter threshold voltage) of the RC IGBT cell 300-B, so that a (forward) current may be blocked from flowing through the RC IGBT cell 300-B. During the forward operating mode, the voltage applied to the gate electrode 112 may be higher than the threshold voltage. As shown in FIG. 3b, a forward current 383 may then flow from the collector electrode via a pn-junction of the collector doping region 134 with the drift doping region and via conductive channels through a first and a second body doping region 116-1, 116-2 of the RC IGBT cell 300-B to the emitter electrode 104.

During a reverse operating mode of a semiconductor device comprising the RC IGBT cell 300-B, the collector electrode may be at a lower electric potential than the emitter electrode 104. This can forward bias pn-junctions between the body doping region 116-1, 116-2 and the drift doping region. A reverse current 384 may then flow from the emitter electrode 104 via the body doping regions 116-1, 116-2 into the drift doping region. Because, within the RC IGBT cell 300-B, the drift doping region extends to the backside surface of the semiconductor substrate 102, where it is in contact with the collector electrode, the reverse current may flow from the drift doping region (directly) to the collector electrode.

Of course, the RC IGBT cell 300-B may also be complementarily doped, meaning that the first conductivity type may be n, and the second conductivity type may be p. The voltages applied to the RC IGBT cell 300-B for the different operating modes may then be of reversed polarities resulting in reversed current directions.

In a semiconductor device (e.g., the semiconductor device 100 of FIG. 1), the emitter electrode 104 contacting the RC IGBT cell 300-B (or a plurality thereof) may be insulated from an emitter electrode contacting one or several FC IGBT cells. In this way, the forward current 383 and/or the reverse current 384 (or fractions thereof) flowing through the RC IGBT cell 300-B (or a plurality thereof) may be used in measurement applications for determining physical quantities of the semiconductor device.

Figure 4:
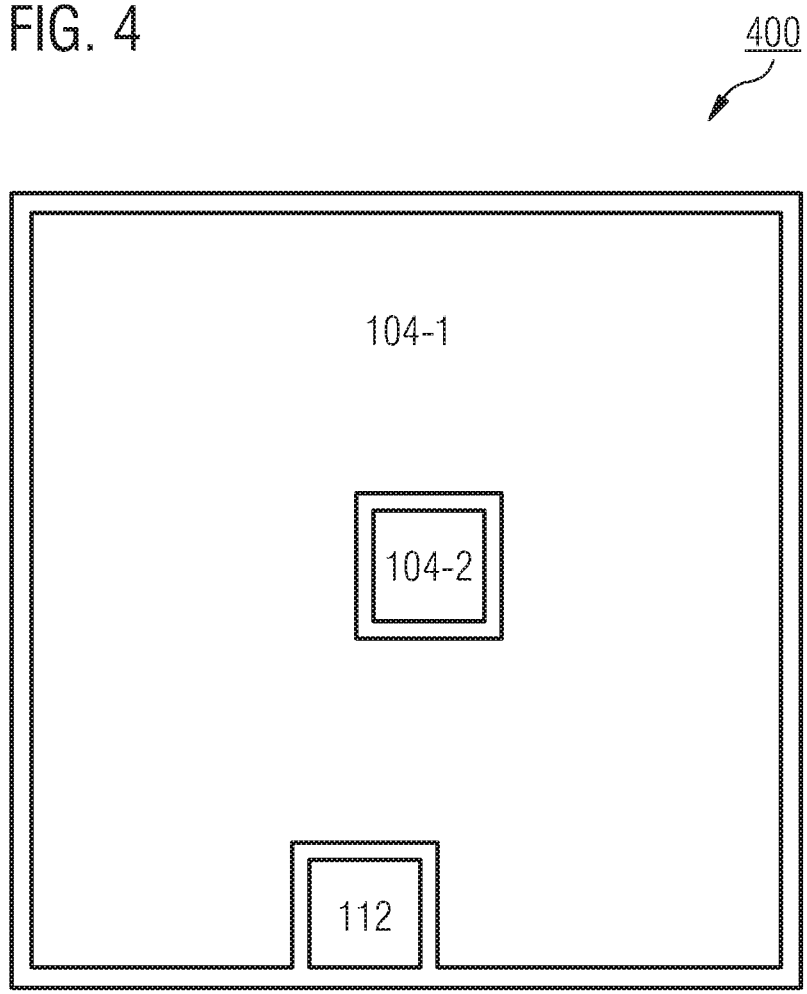
FIG. 4 shows a schematic top view of a semiconductor device.

For further illustration of the principle of providing separate emitter electrodes, FIG. 4 shows a schematic top view of a semiconductor device 400. The semiconductor device 400 may be similar to the semiconductor device 100 of FIG. 1. The semiconductor device 400 comprises a plurality of FC IGBT cells and a plurality of RC IGBT cells. The plurality of FC IGBT cells and the plurality of RC IGBT cells may be arranged in a common semiconductor substrate of the semiconductor device 400. In particular, FIG. 4 shows a schematic top view of a top metallization layer of a wiring layer stack of the semiconductor device 400. The wiring layer stack can comprise lateral wiring elements (e.g., transmission lines, conductive planes and/or contact pads) as well as vertical wiring elements (e.g., vias).

The top metallization layer comprises a first emitter pad 104-1. The first emitter pad 104-1 may be electrically connected to a first emitter electrode that contacts emitter doping regions and body doping regions of the plurality of FC IGBT cells (e.g., IGBT load cells). Furthermore, the top metallization layer comprises a second emitter pad 104-2. The second emitter pad 104-2 may be electrically connected to a second emitter electrode that contacts emitter doping regions and body doping regions of the plurality of RC IGBT cells (e.g., IGBT sense cells). The first and the second emitter pad 104-1, 104-2 are electrically insulated from each other. The first emitter pad covers a larger lateral area of the top metallization plane than the second emitter pad. For example, the lateral area of the first emitter pad 104-1 may be at least 10 times (or at least 25 times, or at least 50 times, or at least 100 times) as large as the lateral area of the second emitter pad 104-2. In this way, the first emitter pad 104-1 may conduct higher currents than the second emitter pad 104-2 and may be electrically connected to a larger number of FC IGBT cells than a number of RC IGBT cells that are electrically connected to the second emitter pad 104-2.

The second emitter pad 104-2 is located at a center of the top metallization plane (or close to the center, e.g., less than 10% of a maximal lateral extension of the semiconductor substrate away from the center) and is laterally surrounded by the first emitter pad 104-1. In the semiconductor substrate located below the wiring layer stack, the plurality of RC IGBT cells may then be located at a center of the semiconductor substrate (or close to the center of the semiconductor substrate) while being laterally surrounded by the plurality of FC IGBT cells. For utilizing the RC IGBT cells for temperature measurement, it may be desired to place the RC IGBT cells (e.g., the RC current sense cells) near to the center of the semiconductor substrate of the semiconductor device 400 (e.g., the IGBT), where the highest temperatures may occur.

Figure 5:
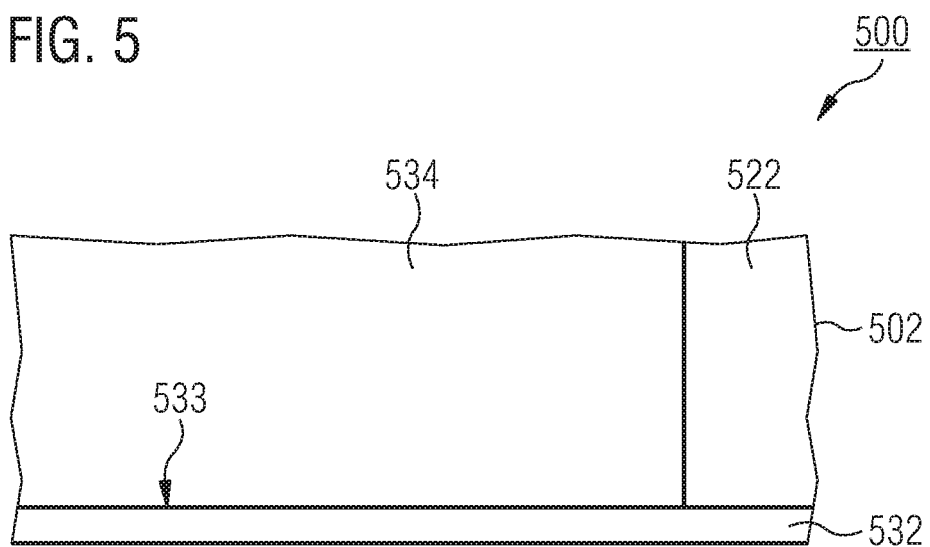
FIG. 5 shows a part of a schematic cross section of an insulated-gate bipolar transistor device.

According to another aspect of the present disclosure, FIG. 5 shows a part of a schematic cross section of an insulated-gate bipolar transistor (IGBT) device 500. The IGBT device 500 comprises a first transistor doping region 534 of a first conductivity type and a second transistor doping region 522 of a second conductivity type. The first transistor doping region 534 and the second transistor doping region 522 are arranged in a common semiconductor substrate 502 of the IGBT device 500. Furthermore, the IGBT device 500 comprises a collector electrode 532 in contact with the first transistor doping region 534 and the second transistor doping region 522 at a backside surface of the semiconductor substrate 502. A contact area 533 between the collector electrode 532 and the first transistor doping region 532 is larger than 70% (or larger than 90%, or larger than 99%, or larger than 99.90%, or larger than 99.99%) of a total contact area between the collector electrode and the backside surface of the semiconductor substrate 502.

Providing a contact between the collector electrode 532 and two doping regions of different conductivity types, can configure the IGBT device 500 to conduct current vertically through the semiconductor substrate 502 (e.g., between a emitter electrode of the IGBT device 500 and the collector electrode 532) both in a forward and a reverse operating mode. In turn this can enable, measuring (e.g., deriving) and/or monitoring physical quantities of the IGBT device 500 such as a forward current in the forward operating mode, a reverse current in the reverse operating mode, and/or a temperature of the IGBT device 500. By dimensioning the contact area 533 between the collector electrode 532 and the first transistor doping region 532 at least to 70% (or larger as stated above) of the total contact area between the collector electrode 532 and the backside surface of the semiconductor substrate 502, the performance of the IGBT device 500 may be improved in terms of conducting, switching, and/or blocking. For example, a larger contact area 533 between the collector electrode 532 and the first transistor doping region 532 can increase a blocking voltage (or breakdown voltage) of the IGBT device 500, reduce switching times (e.g., between the forward, the reverse, and a blocking operating mode) of the IGBT device 500, and/or can decrease a emitter-collector resistance of the IGBT device during the forward operating mode. A contact area between the collector electrode 532 and the second transistor doping region 522 can be smaller than 30% (or smaller than 10%, or smaller than 1%, or smaller than 0.10%, or smaller than 0.01%) and/or larger than 1/500000 (one over five hundred thousand) (or larger than 0.05%, or larger than 0.50%, or larger than 5%) of the total contact area between the collector electrode 532 and the backside surface of the semiconductor substrate 502.

For example, the first transistor doping region 534 is a collector doping region of the IGBT device 500, and the second transistor doping region is a drift doping region 522 of the insulated-gate bipolar transistor device 500.

For example, the IGBT device 500 may be a power semiconductor device. The IGBT device 500 may comprise blocking voltage (or breakdown voltage) of more than more than 10 V (e.g. a blocking voltage of 10 V, 20 V or 50 V), more than 100 V (e.g. a blocking voltage of 200 V, 300 V, 400 V or 500 V) or more than 500 V (e.g. a blocking voltage of 600 V, 680 V, 700 V, 800V or 1000 V) or more than 1000 V (e.g. a blocking voltage of 1200 V, 1500 V, 1700 V or 2000 V).

Figure 6:
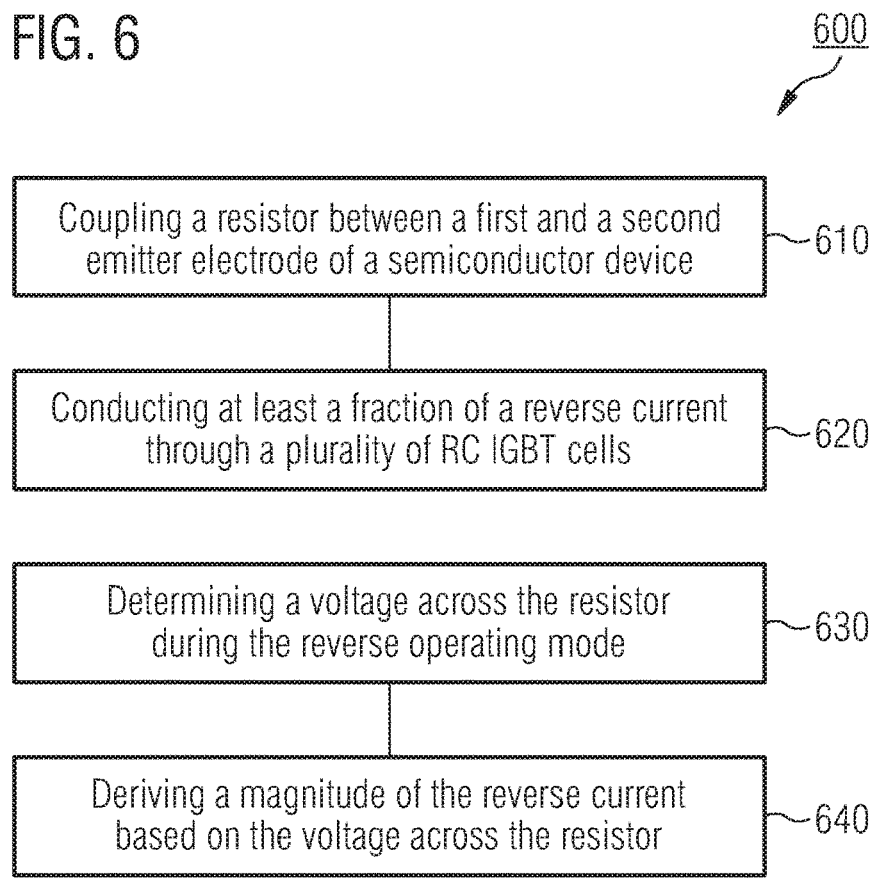
FIG. 6 shows a flow chart of a method for operating a semiconductor device.

FIG. 6 shows a flow chart of a method 600 for operating a semiconductor device. The method comprises coupling 610 a resistor between a first emitter electrode and a second emitter electrode of the semiconductor device. The first emitter electrode is electrically connected to a plurality of FC IGBT cells of the semiconductor device. The second emitter electrode is electrically connected to a plurality of RC IGBT cells of the semiconductor device. Furthermore, the method 600 comprises conducting 620 at least a fraction of a reverse current of the semiconductor device through the plurality of RC IGBT cells during a reverse operating mode of the semiconductor device. Furthermore, the method 600 comprises determining 630 a (first) voltage across the resistor during the reverse operating mode. Furthermore, the method 600 comprises deriving 640 a magnitude of the reverse current based on the voltage across the resistor.

By operating the semiconductor device according to the method 600, a magnitude of the reverse current can be derived. Knowledge about the magnitude of the reverse current can be used in various applications, for example, for controlling the magnitude of the reverse current and/or to take precaution measures if the magnitude of the reverse current exceeds an upper limit. In such a case, a supply voltage of the semiconductor device may be switched off and/or the semiconductor device may be disconnected from the circuit it is operated in. This can increase the reliability of the operation of the semiconductor device and/or of the circuit the semiconductor device is used in.

Deriving 640 the magnitude of the reverse current can additionally comprise deriving a magnitude of the fraction of the reverse current through the plurality of RC IGBT cells and scaling the magnitude of the fraction of the reverse current by a reverse current scaling factor. The reverse current scaling factor can be based on a ratio of a total lateral area of the plurality of RC IGBT cells to a lateral area of a diode. The diode can be external to the plurality of FC IGBT cells and the plurality of RC IGBT cells and can be coupled between the first emitter electrode and a collector electrode of the semiconductor device.

To this end, the method 600 can further comprise conducting at least a second fraction of the reverse current through the diode. For example, the second fraction of the reverse current can amount to at least 70% (or to at least 90%, or to at least 99%, or to at least 99.90%, or to at least 99.99%) of the reverse current.

A total lateral area of the plurality of RC IGBT cells can be the sum of the lateral cross sectional areas of each of the plurality of RC IGBT cells. The fraction of the reverse current flowing through the plurality of RC IGBT cells may flow through this total lateral area of the plurality of RC IGBT cells. In other words, a direction of the fraction of the reverse current flowing through the plurality of RC IGBT cells may be perpendicular to the total lateral area of the plurality of RC IGBT cells. A total lateral area of the diode may be a lateral cross sectional area of the diode, through which the second fraction of the reverse current can flow.

The diode can be a freewheeling diode of the semiconductor device and may be configured to conduct current during the reverse operating mode and to block current during a forward operating mode of the semiconductor device. The diode may be integrated into a common substrate of the FC IGBT cells and the RC IGBT cells or may comprise a separate semiconductor substrate and be integrated into a common semiconductor package together with the common semiconductor substrate of the FC IGBT cells and the RC IGBT cells.

By conducting at least 70% (or more as stated above) of the reverse current through the diode, losses of the semiconductor device during the reverse operating mode may be reduced. For example, the diode may provide a lower resistance to the reverse current then the plurality of RC IGBT cells. The smaller fraction of the reverse current (e.g., less than 30% of the reverse current) flowing through the plurality of RC IGBT cells may then be employed for determining the second fraction of the reverse current and/or the total reverse current while causing only insignificant losses in the semiconductor device.

Additionally, the method 600 can further comprise conducting a forward current of the semiconductor device through the plurality of FC IGBT cells and the plurality of RC IGBT cells during the forward operating mode of the semiconductor device. Furthermore, the method 600 can comprise determining a second voltage across the resistor during the forward operating mode and deriving a magnitude of the forward current based on the second voltage across the resistor. The method 600 may thus allow monitoring the current through the semiconductor device independent of whether the semiconductor device is operating in the forward or in the reverse operating mode as both the magnitude of the forward and the reverse current can be derived. This can improve the reliability of operation of the semiconductor device and/or the circuit or application the semiconductor device is used in.

Deriving a magnitude of the forward current can comprise deriving a magnitude of a fraction of the forward current flowing through the resistor and scaling the magnitude of the fraction of the forward current by a forward current scaling factor. The forward current scaling factor can be based on a ratio of the total number of FC IGBT cells to the total number of RC IGBT cells.

For example, the fraction of the forward current may flow through the plurality of RC IGBT cells and through the resistor that can be connected in series to the plurality of RC IGBT cells. This (first) fraction of the forward current can then cause a second) voltage across the resistor. Having knowledge of the resistance of the resistor (e.g., by circuit design) the magnitude of the first fraction of the forward current flowing through the resistor and hence through the plurality of RC IGBT cells can be derived from the voltage across the resistor. The first fraction of the forward current flowing through the plurality of RC IGBT cells can be proportional to a second (e.g., remaining) fraction of the forward current flowing through the plurality of FC IGBT cells. This proportionality and hence the forward current scaling factor can depend on the ratio of the total number of FC IGBT cells to the total number of RC IGBT cells of the semiconductor device. By multiplying the magnitude of the first fraction of the forward current with this ratio (e.g., with the forward current scaling factor) a magnitude of the second fraction of the forward current flowing through the plurality of FC IGBT cells and/or a magnitude of the (total) forward current can be derived.

For example, conducting the forward current of the semiconductor device can comprise conducting at least 70% (or at least 90%, or at least 99%, or at least 99.90%, or at least 99.99%) of the forward current through the plurality of FC IGBT cells. As an emitter-collector resistance of the FC IGBT cells may be lower than an emitter-collector resistance of the RC IGBT cells, conducting more of the forward current through the plurality of FC IGBT cells can result in a more power efficient operation of the semiconductor device.

Additionally, the method 600 can comprise coupling an electric source between the first and the second emitter electrode during the reverse operating mode. Furthermore, the method 600 can comprise determining a voltage between the first and the second emitter electrode during the reverse operating mode, and deriving a temperature of the semiconductor device based on the voltage between the first and the second emitter electrode. Hence, it can be possible to monitor the temperature of the semiconductor device during its operation. For example, in case the temperature of the semiconductor device exceeds an upper limit, precaution measures may be taken, for instance, increasing a cooling of the semiconductor device (e.g., increasing the speed of a fan for cooling the semiconductor device) or shutting down the semiconductor device and/or the circuit the semiconductor device is used in. In this way, the reliability of operation of the semiconductor device can be improved.

The electric source can be a current source and/or a voltage source (e.g., a small signal current source and/or a small signal voltage source). The electric source may provide a constant (e.g., a temperature stabilized or substantially temperature independent) current to the second emitter electrode. The current provided by the electric source can be different to a load current of the semiconductor device and can provide means for deriving the temperature of the semiconductor device. For example, during the reverse operating mode the load current of the semiconductor device may be at least ten times (or at least a hundred times, or at least a thousand times) as large as the current provided by the electric source. During the reverse operating mode, the load current may, for example, flow through a (freewheeling) diode connected in parallel to the plurality of FC IGBT cells of the semiconductor device.

When coupling the electric source between the first and the second emitter electrode during the reverse operating mode, the electric source may be electrically connected in series to the resistor, such that a series connection comprising the electric source and the resistor is coupled between the first and the second emitter electrode. In this way, the resistor may be incorporated into the electric source. For example, the resistor may serve as an internal resistance or as a feedback resistor of the electric source. Alternatively, when coupling the electric source between the first and the second emitter electrode during the reverse operating mode, the resistor may be decoupled from at least one of the first and the second emitter electrode, and the electric source can be coupled directly between the first and the second emitter electrode.

During the reverse operating mode, the voltage between the first and the second emitter electrode of the semiconductor device can depend on the temperature of the semiconductor device. Because the current of the electric source can be kept constant, the voltage between the first and the second emitter electrode might not be changed by the current of the electric source, but may change with temperature of the semiconductor device. Voltages between the first and the second emitter electrode may then be indicative for temperatures of the semiconductor device.

Additionally, the method 600 can comprise setting a gate voltage of the semiconductor device to a first value during the forward operating mode of the semiconductor device, and setting the gate voltage to a second value when determining the voltage between the first and the second emitter electrode (e.g., during the reverse operating mode). The second value of the gate voltage can be smaller than the first value and can be larger than a threshold voltage (e.g., an emitter-gate threshold voltage) of the semiconductor device. In this way, a temperature dependency of the voltage between the first and the second emitter electrode can be increased, which may facilitate deriving the temperature of the semiconductor device based on the voltage between the first and the second emitter electrode. The gate voltage may be applied to the gate electrodes of both the plurality of FC IGBT cells and of the plurality of RC IGBT cells.

Alternatively, the method 600 can comprise reducing the gate voltage of the semiconductor device below the threshold voltage of the semiconductor device when determining the voltage between the first and the second emitter electrode (e.g., during the reverse operating mode). In this way, the current of the electric source may flow via a pn-junction between a part of a drift doping region and body doping regions comprised by the plurality of RC IGBT cells. A voltage across this pn-junction may comprise a temperature dependency. As the voltage between the first and the second emitter electrode may also depend on the voltage across the pn-junction between the part of the drift doping region and the body doping regions comprised by the plurality of RC IGBT cells, the voltage between the first and the second emitter electrode may be indicative for a temperature of the semiconductor device.

Figure 7A:
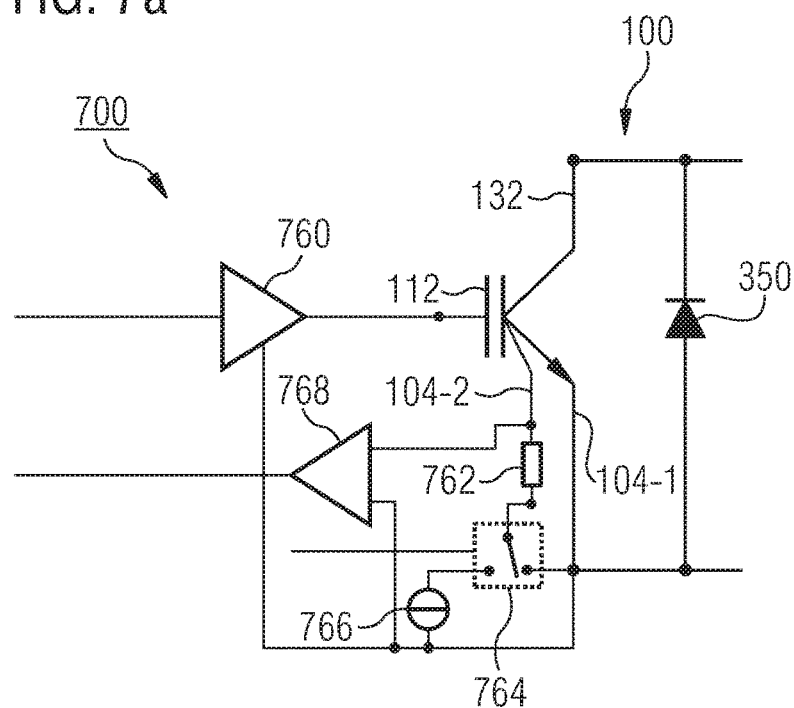
FIG. 7a shows a schematic of a circuit comprising a semiconductor device with a plurality of forward conducting insulated-gate bipolar transistor cells and a plurality of reverse conducting insulated-gate bipolar transistor cells as well as circuitry for monitoring physical quantities of the semiconductor device.

FIG. 7a shows a schematic of a circuit 700 comprising a semiconductor device 100 with a plurality of FC IGBT cells and a plurality of RC IGBT cells as well as circuitry for deriving physical quantities of the semiconductor device 100. The semiconductor device 100 may be similar to the semiconductor device 100 of FIG. 1. In this example, the FC IGBT cells and the RC IGBT cells are npnp-insulated-gate bipolar transistor cells, so that the first conductivity type is p and the second conductivity type is n. A first emitter electrode 104-1 of the semiconductor device 100 is coupled to the plurality of FC IGBT cells and a second emitter electrode of the semiconductor device 100 is coupled to the plurality of RC IGBT cells. A collector electrode 132 of the semiconductor device 100 is coupled to both the plurality of FC IGBT cells and the plurality of RC IGBT cells. Furthermore, the semiconductor device 100 comprises a diode 350. An anode of the diode 350 is electrically connected to first emitter electrode 104-1. A cathode of the diode is electrically connected to the collector electrode 132.

Moreover, the circuit 700 comprises a gate driver amplifier 760, whose output is electrically connected to a gate electrode structure 112 of the semiconductor device 100. The gate electrode structure 112 may comprise the gate electrodes of both the FC IGBT cells and the RC IGBT cells of the semiconductor device 100. An input of the gate driver amplifier 760 may be configured to receive a gate signal of further control circuitry (not shown in FIG. 7a) for controlling the operation of the semiconductor device 100. A resistor 762 (e.g., a sense resistor) comprised by the circuit 700 is coupled between the second emitter electrode 104-2 and a switch 764 (e.g., a single-pole double-throw switch, SPDT switch). A first terminal of the resistor 762 is coupled to the second emitter electrode 104-2 and a second terminal of the resistor 762 is coupled to a common port of the switch 764. A first throw terminal of the switch 764 is coupled to the first emitter electrode 104-1 (and the anode of the diode 350). A second throw terminal of the switch 764 is coupled to a first terminal of an electric source 766 (e.g., a small signal current source) of the circuit 700. A second terminal of the electric source 766 is coupled to the first emitter electrode 104-1. Moreover, the switch 764 is configured to receive a switch signal from the control circuitry to either electrically connect the common terminal with the first or the second throw terminal. Furthermore, the circuit 700 comprises a sense amplifier 768. A first input of the sense amplifier 768 is coupled to the first terminal of the resistor 762 (and to the second emitter electrode 104-2). A second input of the sense amplifier 768 is coupled to the first emitter electrode 104-1. The sense amplifier is configured to amplify a voltage between its first and second input. The output of the sense amplifier 768 may be connected to the control circuitry. The output voltage of the sense amplifier may be indicative for physical quantities (e.g., a forward current, a reverse current and/or a temperature) of the semiconductor device 100.

For example, FIG. 7a shows an example circuit for measurement of current and temperature (of the semiconductor device 100). For complexity reduction, measurement of current and temperature will be explained in individual subsections. In an application, the measurement tasks can be performed subsequently in order to obtain one or more current and temperature signals at every pulse-width-modulation (PWM) cycle.

Figure 7B:
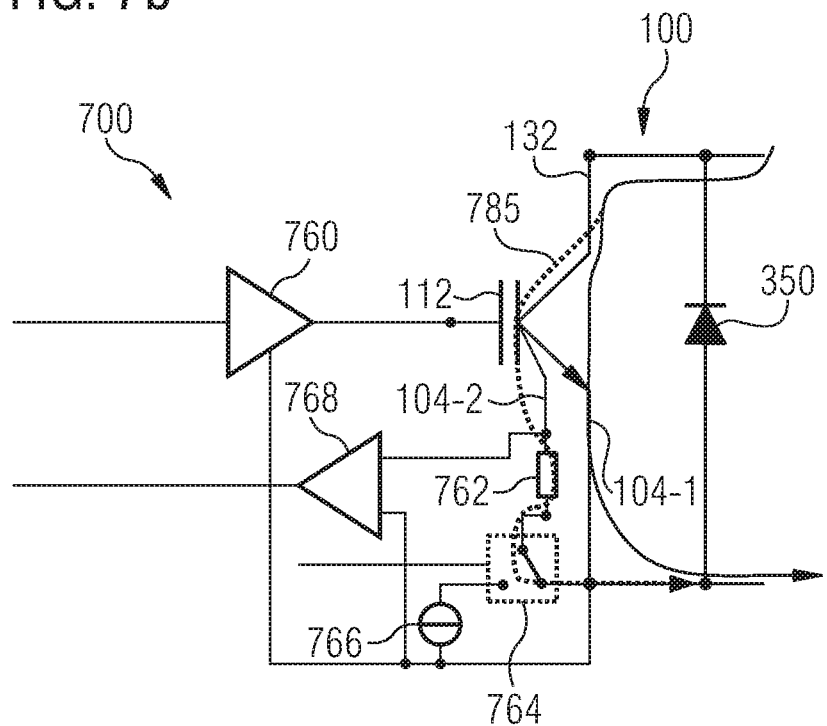
FIG. 7b shows a semiconductor device in a forward operating mode within a circuit configured to derive a magnitude of a forward current of the semiconductor device.

FIG. 7b shows the semiconductor device 100 in a forward operating mode within the circuit 700 of FIG. 7a. In FIG. 7b the circuit 700 is configured to derive a magnitude of a forward current of the semiconductor device 100. To this end, the switch 764 is set such that its common terminal is connected to its first throw terminal.

The forward current of the semiconductor device 100 flows into the semiconductor device at the collector electrode 132 (e.g., neglecting leakage currents of the diode). A first fraction 785 of the forward current flows through the plurality of RC IGBT cells and leaves the semiconductor device 100 at the second emitter electrode 104-2. A second (remaining) fraction of the forward current flows through the plurality of FC IGBT cells and leaves the semiconductor device 100 at the first emitter electrode 104-1. The first fraction 785 of the forward current flows further through the resistor 762 and via the switch 764 to the first emitter electrode (or to a wiring element connected to the first emitter electrode), where it joins the second fraction of the forward current flowing through the plurality of FC IGBT cells. The first fraction 785 of the forward current causes a (first) voltage across the resistor 762. The (first) voltage across the resistor 762 is amplified by the sense amplifier 768 and can be provided to a control circuit, which may be configured to derive a magnitude of the first fraction 785 of the forward current based on the (first) voltage across the resistor 762. Moreover, the control circuit may be configured to scale the magnitude of the first fraction 785 of the forward current by a forward current scaling factor to derive the magnitude of the (total) forward current and/or the magnitude of the second fraction of the forward current flowing through the plurality of FC IGBT cells. As explained in the context of FIG. 6, the forward current scaling factor can be based on a ratio of a total number of FC IGBT cells to a total number of RC IGBT cells of the semiconductor device 100, For example, FIG. 7b shows an insulated-gate bipolar transistor (IGBT) in a conduction state (e.g., the forward operating mode). The reverse conducting (RC) sense cells (e.g., the RC IGBT cells) can be used for current sensing in positive direction.

Figure 7C:
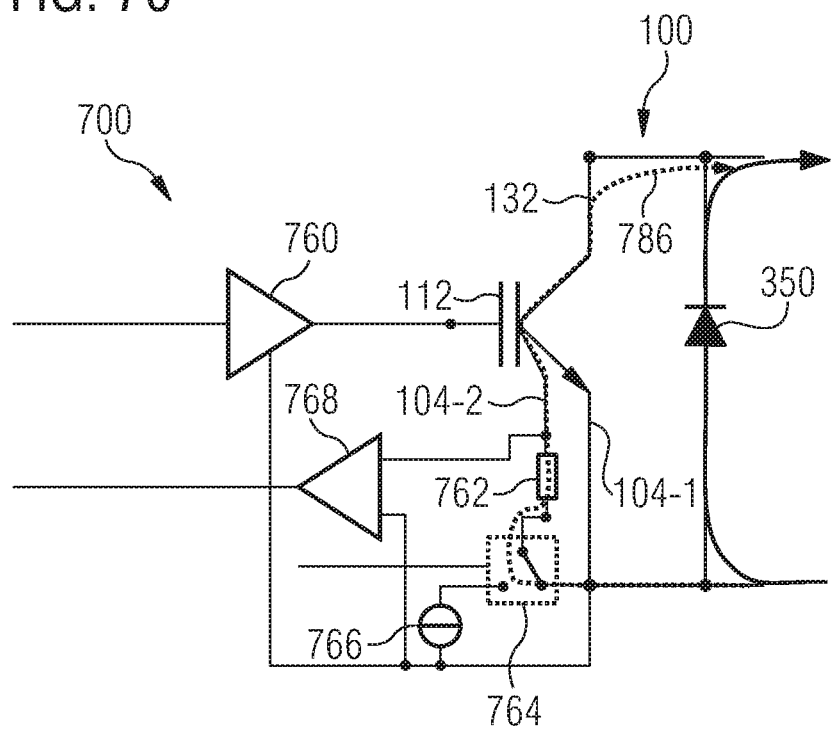
FIG. 7c shows a semiconductor device in a reverse operating mode within a circuit configured to derive a magnitude of a reverse current of the semiconductor device.

FIG. 7c shows the semiconductor device 100 in a reverse operating mode within the circuit 700 of FIG. 7a. In FIG. 7c the circuit 700 is configured to derive a magnitude of a reverse current of the semiconductor device 100. To this end, the switch 764 is set such that its common terminal is connected to its first throw terminal.

As the plurality of FC IGBT cells are configured to block current from flowing through them during the reverse operating mode, the reverse current splits up between the plurality of RC IGBT cells and the diode 350. A first fraction 786 of the reverse current may flow via the switch 762 and the resistor 762 through the plurality of RC IGBT cells to the collector electrode 132. A second (remaining) fraction of the reverse current may flow through the diode 350 and join the first fraction 786 of the reverse current at the collector electrode 132 (or at a wiring element connected to the collector electrode 132). The first fraction 786 of the reverse current causes a (second) voltage across the resistor 762. The (second) voltage across the resistor 762 is amplified by the sense amplifier 768 and can be provided to a control circuit, which may be configured to derive a magnitude of the first fraction 786 of the reverse current based on the (second) voltage across the resistor 762. Moreover, the control circuit may be configured to scale the magnitude of the first fraction 786 of the reverse current by a reverse current scaling factor to derive the magnitude of the (total) reverse current and/or the magnitude of the second fraction of the reverse current flowing through the diode 350. As explained in the context of FIG. 6, the reverse current scaling factor can be based on a ratio of a total lateral area of the plurality of RC IGBT cells to a lateral area of the diode 350.

For example, FIG. 7c shows an IGBT (e.g., the semiconductor device 100) in an off state (e.g., the reverse operating mode). The diode 350 is freewheeling. The RC sense cells (e.g., the RC IGBT cells) can be used for current sensing in negative direction. In other words, the RC IGBT sense emitter (e.g., the second emitter electrode) can be connected to a (sense) resistor 762. The voltage drop across this resistor 762 can give a current signal which can correlate with the IGBT load current (e.g., the forward and the reverse current of the semiconductor device 100). Sense current can be idealized correlated with (number of sense cells/number of load cells) or, in case of the diode conduction, it can be (diode area of sense cells/diode area of antiparallel diode). The concept with the basic current flow paths are shown in FIGS. 7b-c.

Figure 7D:
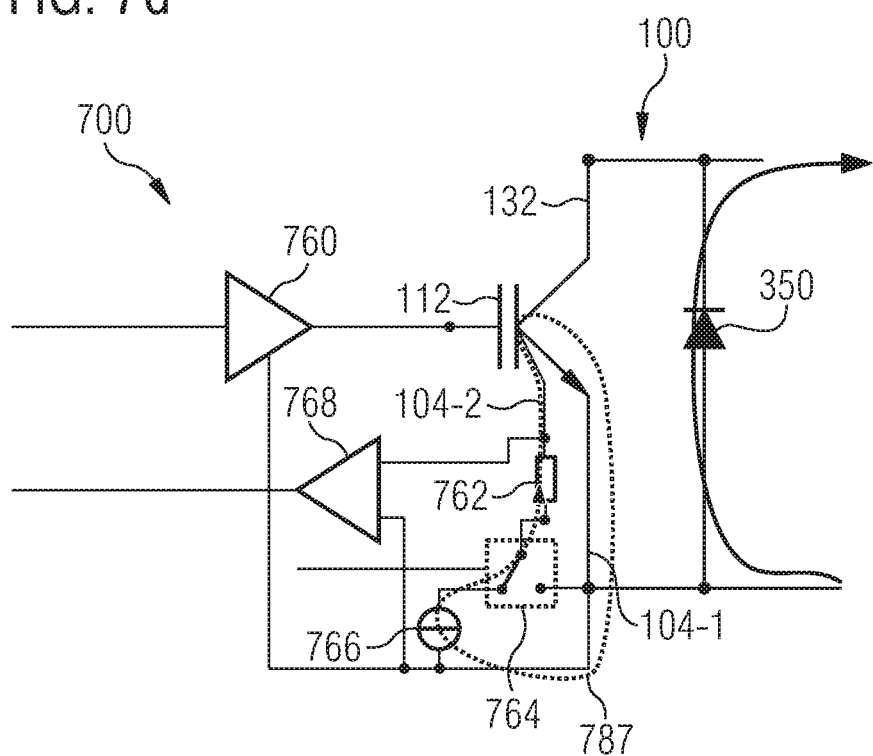
FIG. 7d shows a semiconductor device in a reverse operating mode within a circuit configured to derive a temperature of the semiconductor device.

FIG. 7d shows the semiconductor device 100 in a reverse operating mode within the circuit 700 of FIG. 7a. In FIG. 7d the circuit 700 is configured to derive a temperature of the semiconductor device 100. To this end, the switch 764 is set such that its common terminal is connected to its second throw terminal. Moreover, a gate voltage supplied by the gate driver amplifier 760 commonly to the pluralities of FC IGBT cells and RC IGBT cells may be larger than a threshold voltage (e.g., a gate-emitter threshold voltage) of the pluralities of FC IGBT cells and RC IGBT cells.

When the (auxiliary) switch 764 connects the electric source 766 (e.g., a small signal current source or voltage source) to the sense resistor 762, it is possible to inject a small current 787 (e.g., less than 1 A) in reverse direction in the plurality of RC IGBT cells (e.g., the current sense cells). This injected current 787 can flow in normal direction (e.g., forward direction) via the plurality of FC IGBT cells (e.g., the load cells) back to the electric source 766.

Figure 7E:
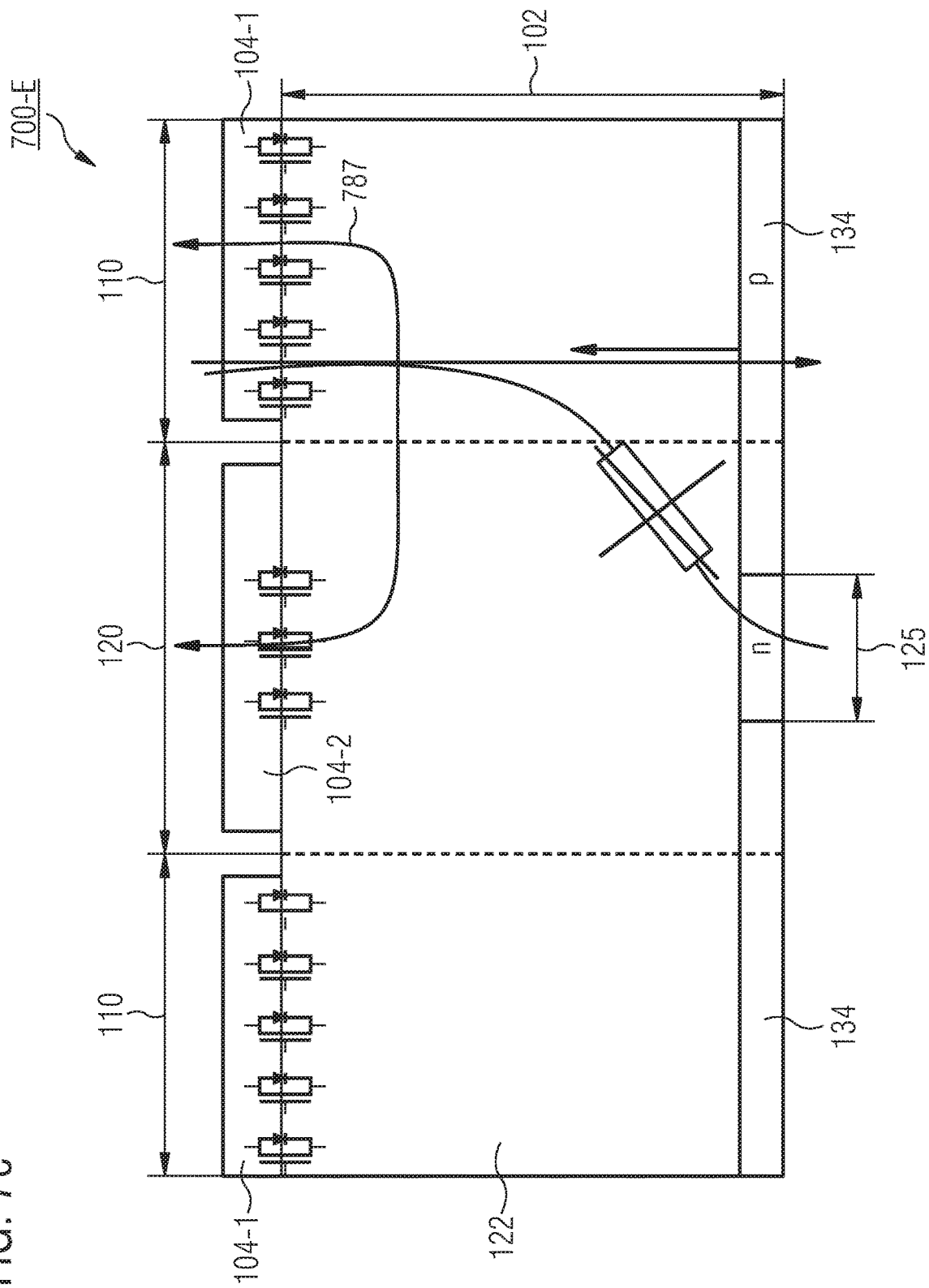
FIG. 7e shows another schematic cross section of a semiconductor device.

This is illustrated in more detail in FIG. 7e, which shows a schematic cross section of a semiconductor device 700-E similar to the semiconductor device 100 of FIGS. 7*a-d*. The current 787 injected from the electric source can flow via the second emitter electrode 104-2 into the plurality 120 of RC IGBT cells. In particular, the injected current 787 can flow via a metal-oxide semiconductor field effect transistor (MOSFET) structure of the plurality 120 of RC IGBT cells into a drift doping region 122 of the semiconductor device 700-E, because the gate voltage of the RC IGBT cells is larger than their threshold voltage. Because the gate voltage is also applied to the plurality 110 of FC IGBT cells, the injected current 787 may flow from the part of the drift doping region 122 of the plurality 120 of RC IGBT cells to the part of the drift doping region 122 of the plurality 110 of FC IGBT cells and via a MOSFET structure of the plurality 110 of FC IGBT cells to the first emitter electrode 104-1. The injected current may then flow back to the electric source 766 (in an alternative embodiment the direction of the injected current 787 may be reversed).

The MOSFET structures of the plurality 120 of RC IGBT cells and the plurality 110 of FC IGBT cells can comprise emitter doping regions, body doping regions, and a part of the drift doping region comprised by the RC IGBT cells and the FC IGBT cells, respectively. A conductive channel can be formed in the body doping regions due to the application of the gate voltage larger than the threshold voltage of the RC IGBT cells and the FC IGBT cells.

In this operating mode (e.g., temperature detection during the reverse operating mode) the gate of the IGBT (e.g., of the plurality of RC IGBT cells and FC IGBT cells) may be turned-on and thus the output characteristics of two series connected MOSFET structures (e.g., the MOSFET structure of the plurality of RC IGBT cells connected in series to the MOSFET structure of the plurality of FC IGBT cells) can be detected with the measurement circuit 700 of FIG. 7*a-d*, Furthermore, the injected current 787 might not flow to the pn backside of the IGBT (e.g., to the pn-junction between the drift doping region 122 and the collector doping region 134). The output characteristic (of the MOSFET structures) may be temperature-dependent and thus a signal correlating to the chip temperature (e.g., the temperature of the semiconductor device 100, 700-E) can be detected. Because the series connection of the MOSFET structures is located between the first and the second emitter electrode 104-1, 104-2, a voltage between the first and the second emitter electrode 104-1, 104-2 can be indicative for the temperature of the semiconductor device 100, 700-E. This voltage can be amplified by the sense amplifier 768. A control circuit connected to the output of the sense amplifier 768 can be configured to derive the temperature of the semiconductor device 100 based on the voltage between the first and the second emitter electrode 104-1, 104-2.

In this mode the IGBT (e.g., the pluralities of FC IGBT cells and RC IGBT cells) can be turned-on with a reduced gate voltage (e.g., gate drivers with weak turn-in or with two level turn-on features can be used). For example, while the gate voltage of the semiconductor device may be set to a first value during the forward operating mode, the gate voltage may be set to a second value smaller than the first value and larger than the threshold voltage when determining the voltage between the first and the second emitter electrode during the reverse operating mode. With such a reduced gate voltage the output characteristic of the MOSFET structures can reveal a stronger dependence on temperature as compared to a case where both MOSFET channels are fully turned-on. It may then be easier for the signal processing (e.g., the control circuit) to derive a more precise temperature value. For the lower gate voltage, even linear mode might not be critical, as the energy dissipation can be controlled via the electric source 766 (e.g., the small signal source).

In summary, FIGS. 7*d-e* show temperature sensing with GATE ON. The small signal source (e.g., the electric source 766) feeds current to two in series connected MOSFETS e.g., the MOSFET structures of the RC Sense IGBT cells and the load IGBT cells). The current might not flow to the IGBT backside. A temperature signal can be obtained from the output characteristics of the turned-on MOSFET structures. Reduced gate voltage can facilitate signal processing.

Figure 7F:
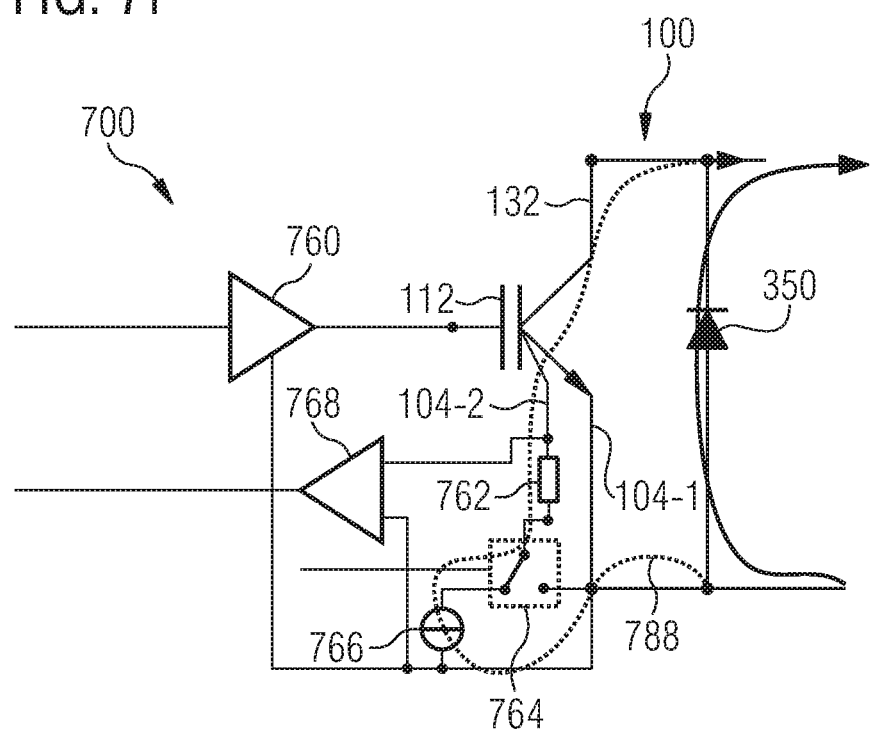
FIG. 7*f* shows a semiconductor device in a reverse operating mode within a circuit configured in an alternative way to derive a temperature of the semiconductor device.

FIG. 7*f* illustrates an alternative approach for deriving a temperature of the semiconductor device 100 with additional aid of the circuit 700 of FIG. 7*a*, To this end, the semiconductor device 100 is in a reverse operating mode, but the gate voltage supplied by the gate driver amplifier 760 commonly to the pluralities of FC IGBT cells and RC IGBT cells may be smaller than the threshold voltage (e.g., the gate-emitter threshold voltage) of the pluralities of FC IGBT cells and RC IGBT cells. The switch 764 is set such that its common terminal is connected to its second throw terminal.

When the electric source 766 (e.g., a small signal source) and sense resistor 762 is connected in the same way as explained before but the gate is turned off (e.g., the gate voltage of the semiconductor device 100 is reduced below the threshold voltage of the semiconductor device 100), the electric source 766 can feed current 788 into the plurality of RC IGBT cells (e.g., the RC sense IGBT cells). As the plurality of FC IGBT cells (e.g., the IGBT load cells) with gate off are turned off, the current 788 can flow via the load diode cathode (e.g., the cathode of the diode 350), which may have a potential of about −1.4 V compared to the load emitter (e.g., the first emitter electrode 104-1). Thus, the signal (e.g., the voltage between the first and the second emitter electrode 104-1, 104-2) may correlate to the temperature of the RC IGBT cells (e.g., the RC sense IGBT cells, (pn body diode)). Additionally, the signal may correlate to the temperature and load of the load diode (e.g., the diode 350), which may enable deriving a temperature of the diode 350.

Furthermore, instead of a small signal current source a voltage source can be connected for this mode (e.g., during the reverse operating mode when determining the temperature of the semiconductor device 100 while the gate voltage is reduced below the threshold voltage). The current flow (of the current of the small signal voltage source) can be in same direction and paths (as for a small signal current source). The difference can be that the current (of the small signal voltage source) can be limited only by the output characteristics of the (sense) RC IGBT cells, which may be the weakest part in this circuit (e.g., substantially a short circuit characteristic can be measured). This characteristic can be strongly temperature dependent and the current can be measured via the voltage drop across the sensing resistor, e.g., the resistor 762 (I(Tj)=Uresistor/Rsense).

For example, FIG. 7*f* illustrates temperature sensing with GATE OFF. The small signal source (e.g., the electric source 766) can feed current to the RC Sense IGBT cell (e.g., the plurality of RC IGBT cells) and as the IGBT load cell (e.g., the plurality of FC IGBT cells) are in blocking operating mode the current can flow to load diode cathode (e.g., the cathode of the diode 350).

Figure 7G:
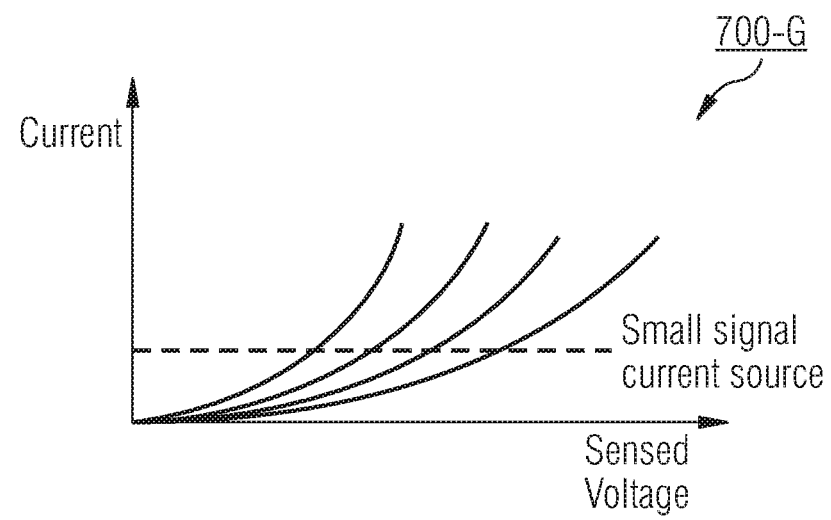
FIG. 7*g* illustrates an example of a temperature dependent output characteristic of a pn diode.

FIG. 7*g* illustrates a basic example of a temperature dependent output characteristic 700-G of a pn junction (e.g., a pn diode) at different temperatures. This signal can be used in order to measure temperatures of the junction. In other words, FIG. 7g shows temperature sensing via the voltage drop of pn junctions.

In FIG. 7g, a voltage sensed across a pn junction is plotted on the horizontal axis and the current across the pn junction is plotted on the vertical axis. The different curves correspond to different temperatures of the pn junction. For example, the temperature of the pn junction may decrease from the leftmost curve to the rightmost curve. The pn junction, where the voltage is sensed by the circuit 700, may be the pn junction between the part of the drift doping region and a body doing region (or body doping regions) of the plurality of RC IGBT cells. Because the current of the electric source 766 (e.g., a small signal current source) of the circuit 700 can be kept constant (e.g., can be temperature stabilized or temperature independent), a change in the sensed voltage across the pn junction (which may be correlated to the voltage between the first and the second emitter electrode 104-1, 104-2) may be substantially due to a change of temperature of the pn junction and thus of the semiconductor device 100, for example.

FIG. 8 shows a single phase of a 3-phase sine (space vector) modulated motor inverter application 800. Depending on the motor current direction and the pulse pattern of the corresponding switches the respective mode—current or temperature sensing—can be selected.

For example, when the IGBT is the control switch (it conducts and controls the current by the on time, e.g., it is in the forward operating mode) it is acting in current sensing mode. Thus, also load saturation and short circuit conditions can be measured. When the IGBT/Diode combination is in the freewheeling (e.g., in the reverse operating mode) it can be selected whether the diode current or the IGBT temperature is measured. With a communication between HighSide (e.g., a HighSide IGBT) and LowSide (e.g., a LowSide IGBT) especially the diode current measurement signal can be calibrated, because the current of the LowSide during the control state can be the same as the current in the subsequent diode freewheeling. In freewheeling the current signal can have a lower priority (as it might not be directly controlled by the IGBTs) and thus this period can be used for the temperature sensing as shown in the FIG. 8. In other words, FIG. 8 illustrates subsequent current and temperature measurement, when employing semiconductor devices comprising a plurality of FC IGBT cells and a plurality of RC IGBT cells according to embodiments of this disclosure.

Compared to other insulated-gate bipolar transistor (IGBT) devices, embodiments of the present disclosure may be superior in terms of performance regarding blocking, conducting, and/or switching, in terms of current sensing during diode (freewheeling) conduction, in terms of temperature sensing, and/or in terms of manufacturing effort. These other IGBT devices can, for instance, be an IGBT with on-chip current sense and temperature sense, a reverse conducting (RC) IGBT with on-chip current sense and temperature sense, and/or an IGBT with MOSFET current sense and temperature sense. Large high current IGBTs can internally comprise several thousands of paralleled IGBT cells.

In an IGBT with on-chip current sense and temperature sense, several of these cells can be commonly connected to a collector (chip backside) but can comprise a separate "sense emitter" connection. This sense emitter can be connected to a measurement circuit (e.g. resistor and voltage measurement), representing a current minor. With a factor of about (number of sense cells/number of load cells) a small amount of current can flow through the measurement path and thus the current flowing in the IGBT load cells can be measured with this correlation. During freewheeling operation (i.e. when the IGBT with on-chip current sense and temperature sense is blocking and an antiparallel diode is conducting) current might not be sensed with this concept as sense and load IGBT cells are both in blocking state.

As the sense cells (of the IGBT with on-chip current sense and temperature sense) may only conduct in coincide with the load cells, it might not be possible to measure the temperature with these current sense cells. Therefore, for temperature measurement small additional pn diodes can be implemented in an individual area of the chip (on-chip temperature sense) of the IGBT with on-chip current sense and temperature sense. The area, which these pn diodes consume, can reduce the active IGBT area and furthermore additional process steps may be introduced for manufacturing these temp sense diodes in the IGBT process. The temp sense diodes may also be very sensitive to ESD (electrostatic discharge) events and may need to be further protected which can bring additional complexity to this solution.

Embodiments of this disclosure may be superior to IGBTs with on-chip current sense and temperature sense, because in IGBTs with on-chip current sense and temperature sense active area may be lost due to space being provided for two contact pads of the temperature sense diodes. Moreover, compared to embodiments of this disclosure, additional process layers during the IGBT production (e.g., for the temp sense diodes, for stripe cell structures, and/or possibly also for current sense) may be required for IGBTs with on-chip current sense and temperature sense. For IGBTs with on-chip current sense and temperature sense it might not be possible to (directly) sense a temperature of an antiparallel diode (only the IGBT can comprise this temp/current sense feature). Moreover, while a magnitude of a reverse current of embodiments of the present disclosure may be derived, this might not be possible in IGBTs with on-chip current sense and temperature sense, because when the (antiparallel) diode is conducting there might not be any current signal available (only the IGBT can comprise this temp/current sense feature). Furthermore, due to weak ESD robustness of the temp sense diodes, IGBTs with on-chip current sense and temperature sense may be less robust than embodiments of the present disclosure.

In a reverse conducting IGBT (RC IGBT), a collector doping region (e.g., a p+ area) in contact with a collector electrode of the RC IGBT can be partially removed (local MOSFET structure) and thus a suitable current path in the reverse direction can be made. Compared to a pure MOSFET structure the blocking capability (blocking voltage vs, chip thickness) can be still much better and the conduction behavior can be still bipolar and thus higher current densities can be achieved. In RC IGBTs the same concept of on chip current sense and temperature sense diodes can be implemented as in an IGBT with on-chip current sense and temperature sense.

Embodiments of the present disclosure may comprise a better electrical performance (in regarding blocking, conducting, and/or switching than RC IGBTs with on-chip current sense and temperature sense. In RC IGBTs with on-chip current sense and temperature sense, a balance between IGBT and (antiparallel) diode performance may require compromises (e.g. if lifetime killing may need to be introduced to reduce reverse recovery during diode operation and/or the on-state losses during IGBT operation may be increased). Furthermore, RC IGBTs with on-chip current sense and temperature sense might not be turned on during freewheeling operation (conduction of the diode during the reverse operating mode). Otherwise the carrier density may be reduced resulting in higher conduction losses (RC-D). Compared to embodiments of the present disclosure, more complex PWM (pulse width modulation) pulse patterns may be required in RC IGBTs with on-chip current sense and temperature sense (decision depending on current flow direction) (RC-DC, where the MOS-gated diode operation may be used as a feature).

Embodiments of this disclosure may be superior to RC IGBTs with on-chip current sense and temperature sense, because in RC IGBTs with on-chip current sense and temperature sense active area may be lost due to space being provided for two contact pads of the temperature sense diodes. Moreover, compared to embodiments of this disclosure, additional process layers during the IGBT production (e.g., for the temp sense diodes) may be required for RC IGBTs with on-chip current sense and temperature sense. Furthermore, due to weak ESD device robustness of the temp sense diodes, RC IGBTs with on-chip current sense and temperature sense may be less robust than embodiments of the present disclosure.

IGBTs with MOSFET current sense and temperature sense are IGBTs which instead of a separated IGBT sense emitter have some MOSFET cells implemented for current sensing. Background for this is the highly non-linear output characteristics of the IGBT cells: when the emitter sense is connected to a sense resistor to measure the sense current by the voltage drop over the resistor, the source reference for the emitter cells may be shifted by the voltage drop. As a result, the load current through the sense cells may be strongly reduced, due to the steep IV curve (e.g., current-voltage curve). Thus, the ratio between load and current sense current may alter current-dependently (voltage drop over sense) leading to a highly non-linear behavior. The output characteristics of the MOS cells may be linear and less steep, thus the current-dependent mismatch of load and sense cell operation may be reduced.

An IGBT with reverse conducting current sense cells may be clearly differentiating to these IGBT with MOSFET sense cells, because the MOS current sensor may comprise different front side (emitter) cell structures and thus two different cell designs in a chip, which may result in higher production efforts and may show imbalanced dynamic switching behavior. Furthermore, the MOS current sensor might not be a pure unipolar device, which can mean that hole current can occur and also may need to be removed via the load cell structures. Otherwise there may be the risk for latch-up of the devices.

Embodiments of the present disclosure may be superior to IGBTs with MOSFET current sense and temperature sense, because in IGBTs with MOSFET current sense and temperature sense there may be a static difference between the load cell (IGBT) and the sense cell (MOSFET) output characteristics resulting in a systematic mismatch between sense and load current. Moreover, in IGBTs with MOSFET current sense and temperature sense there may be a different behavior of MOSFET and IGBT switching. Longer times may then be required to get stable signals. Moreover, compared to embodiments of this disclosure, additional process layers during the IGBT production (e.g., for the temp sense diodes) may be required for IGBTs with MOSFET current sense and temperature sense. Furthermore, due to weak ESD robustness of the temp sense diodes, IGBTs with MOSFET current sense and temperature sense may be less robust than embodiments of the present disclosure. Moreover, in IGBTs with MOSFET current sense and temperature sense front-side (Emitter) cell design for load and sense cells may be different and may thus require more design and production efforts.

At higher working voltages (e.g., larger than 200 V) IGBTs and diodes may be semiconductors used in power electronics systems (DC/DC, AC/DC, DC/AC and AC/AC converters) because of their superior blocking and conducting/switching performance. In an application, for control and monitoring of such power electronics systems, it may be desired to determine the voltage, current and temperature in the switches. Representing the electrical key components, it is often preferred to measure voltages, temperatures and currents in the switch directly rather than to only estimate them (e.g. when measured externally). Whereas voltages can be measured quite simply, the task may get more complex when currents and temperatures may need to be measured. The task may get even more complex, when these parameters are to be measured directly in/on these key components (IGBTs, diodes).

To address at least some of these tasks, it is provided an insulated-gate bipolar transistor (IGBT) with a reverse conducting (RC) current sense emitter according to another aspect of the present disclosure. The part (e.g., the IGBT with a reverse conducting current sense emitter) can be used for sensing current in positive and negative direction (e.g., during a forward and a reverse operating mode, respectively) and in addition the reverse conducting current sense emitter can also used for an on-chip temperature sensing.

Additional temperature sense diodes or additional pads/connections can be avoided. The proposed IGBT concept may be easier for production. Furthermore, the IGBT performance might not be compromised between forward and backward operation (e.g. lifetime killing for diode operation resulting in higher Vcesat for IGBT operation) compared to other reverse conducting concepts as only a few sense cells (e.g., a plurality of RC IGBT cells) may be designed as reverse conducting IGBT. The plurality of RC IGBT cells may be connected to the reverse conducting current sense emitter (e.g., a second emitter electrode of the proposed IGBT). The IGBT might not need special gate drive patterns (compared to RC-IGBTs) when the proposed IGBT is used with on chip current sensing only. Simple low voltage signal processing and simple patterns may be additionally provided to the IGBT with a reverse conducting current sense emitter, when additionally an (optional) temp sensing feature is desired.

Load cells (e.g., a plurality of FC IGBT cells) of the IGBT with a reverse conducting current sense emitter can be structured in trench technology, but also in micro pattern trench technology. The load cells may be connected to a first emitter electrode of the proposed IGBT. The IGBT load cells might not conduct in reverse direction (e.g., may be configured to block current during the reverse operating mode) and thus an antiparallel diode may be additionally provided for freewheeling. The proposed IGBT can be fully optimized (blocking, conducting and switching) and also the antiparallel diode (or antiparallel diodes) can be optimized for their purpose (e.g., for freewheeling)

The separately connected sense emitter cells (e.g., the plurality of RC IGBT cells) may be structured as reverse conducting IGBT. For example, only the separately connected sense emitter cells may be structured as reverse conducting IGBT. These sense cells may thus feature a lower performance but may anyway just conduct a very small amount of current for the signal processing (current and optional temperature sensing purpose). Thus, a lower performance in these sense cells might not be considered a drawback for the system performance.

In freewheeling phase (e.g., during the reverse operating mode) the antiparallel diode may conduct and the IGBT load cells (e.g., the plurality of FC IGBT cells) might not conduct. But according to the conductivity of the reverse conducting current sense IGBT cells (e.g., the plurality of RC IGBT cells) a small amount of freewheeling current can flow in the reverse direction and consequently also a freewheeling current (e.g., a reverse current) can be sensed in the system.

The load IGBT (e.g., the plurality of FC IGBT cells) does not conduct in freewheeling phase (e.g., during the reverse operating mode) and thus charge carriers from the load IGBT might not disturb the sense cell operation. Due to this combination of IGBT (e.g., the plurality of FC IGBT cells) and RC sense IGBT (e.g., the plurality of RC IGBT cells) it is also possible to connect the sense emitter cells (e.g., the plurality of RC IGBT cells) to a different voltage potential and e.g. to connect a current source to measure (e.g., derive) the temperature of the IGBT. For the proposed IGBT, manufacturing processes may be easier than for other IGBT devices, as the structuring of the sense and load cells may be similar and dedicated processes for diodes (e.g., temperature sense diodes) can be avoided. Utilizing the sense emitter for temperature measurement may be an optional feature (e.g. for low cost systems which may require minimum effort for gate driver, signal processing, etc.).

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A semiconductor device, comprising:
   a plurality of forward conducting insulated-gate bipolar transistor cells configured to conduct a current in a forward operating mode of the semiconductor device and to block a current in a reverse operating mode of the semiconductor device; and
   a plurality of reverse conducting insulated-gate bipolar transistor cells configured to conduct a current both in the forward operating mode and in the reverse operating mode,
   wherein the plurality of forward conducting insulated-gate bipolar transistor cells and the plurality of reverse conducting insulated-gate bipolar transistor cells are arranged in a common semiconductor substrate of the semiconductor device,
   wherein the semiconductor substrate comprises a collector doping region of a first conductivity type and a drift doping region of a second conductivity type,
   wherein the collector doping region separates the drift doping region from a backside surface of the semiconductor substrate within a forward conducting insulated-gate bipolar transistor cell,
   wherein the drift doping region extends vertically to the backside surface of the semiconductor substrate within a reverse conducting insulated-gate bipolar transistor cell.

2. The semiconductor device of claim 1, wherein a total number of forward conducting insulated-gate bipolar transistor cells of the semiconductor device is at least twice as large as a total number of reverse conducting insulated-gate bipolar transistor cells of the semiconductor device.

3. The semiconductor device of claim 1, wherein during the forward operating mode the plurality of reverse conducting insulated-gate bipolar transistor cells is configured to conduct at most 30% of a total current through the semiconductor device.

4. The semiconductor device of claim 1, wherein during the reverse operating mode the plurality of reverse conducting insulated-gate bipolar transistor cells is configured to conduct at most 30% of a total current through the semiconductor device.

5. The semiconductor device of claim 1, further comprising:
a first emitter electrode electrically connected to at least one of the plurality of forward conducting insulated-gate bipolar transistor cells; and
a second emitter electrode electrically connected to at least one of the plurality of reverse conducting insulated-gate bipolar transistor cells.

6. The semiconductor device of claim 1, wherein the plurality of forward conducting insulated-gate bipolar transistor cells laterally surrounds the plurality of reverse conducting insulated-gate bipolar transistor cells.

7. The semiconductor device of claim 1, wherein a minimum lateral distance along the backside surface of the semiconductor substrate from any of the plurality of forward conducting insulated-gate bipolar transistor cells to a portion of the drift doping region located at the backside surface of the semiconductor substrate is larger than 1 μm.

8. The semiconductor device of claim 1, wherein at least some of the plurality of reverse conducting insulated-gate bipolar transistor cells are arranged laterally adjacent to each other, and wherein a maximum width of the drift doping region at the backside surface of the semiconductor substrate is larger than a cell pitch of the adjacently arranged reverse conducting insulated-gate bipolar transistor cells.

9. The semiconductor device of claim 1, further comprising a diode external to both the plurality of forward conducting insulated-gate bipolar transistor cells and the plurality of reverse conducting insulated-gate bipolar transistor cells, wherein the diode is configured to conduct at least 70% of a total current through the semiconductor device during the reverse operating mode.

10. A semiconductor device, comprising:
a plurality of forward conducting insulated-gate bipolar transistor cells configured to conduct a current in a forward operating mode of the semiconductor device and to block a current in a reverse operating mode of the semiconductor device;
a plurality of reverse conducting insulated-gate bipolar transistor cells configured to conduct a current both in the forward operating mode and in the reverse operating mode; and
a diode external to both the plurality of forward conducting insulated-gate bipolar transistor cells and the plurality of reverse conducting insulated-gate bipolar transistor cells,
wherein the diode is configured to conduct at least 70% of a total current through the semiconductor device during the reverse operating mode.

11. A semiconductor device, comprising:
a plurality of forward conducting insulated-gate bipolar transistor cells configured to conduct a current in a forward operating mode of the semiconductor device and to block a current in a reverse operating mode of the semiconductor device;
a plurality of reverse conducting insulated-gate bipolar transistor cells configured to conduct a current both in the forward operating mode and in the reverse operating mode;
a first emitter electrode contacting the plurality of forward conducting insulated-gate bipolar transistor cells at a first side of the semiconductor device;
a second emitter electrode contacting the plurality of reverse conducting insulated-gate bipolar transistor cells at the first side of the semiconductor device; and
a collector electrode contacting the plurality of forward conducting insulated-gate bipolar transistor cells and the plurality of reverse conducting insulated-gate bipolar transistor cells at a second side of the semiconductor device opposite the first side,
wherein the first emitter electrode is connected to a load source and the second emitter electrode is connected to a current sense source.

\* \* \* \* \*